United States Patent
Yoon et al.

(10) Patent No.: US 8,039,905 B2
(45) Date of Patent: Oct. 18, 2011

(54) SEMICONDUCTOR DEVICE

(75) Inventors: Young-Bae Yoon, Yongin-si (KR);
Jeong-Dong Choe, Anyang-si (KR);
Dong-Hoon Jang, Seoul (KR); Ki-Hyun Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 176 days.

(21) Appl. No.: 12/382,232

(22) Filed: Mar. 11, 2009

(65) Prior Publication Data
US 2009/0230456 A1 Sep. 17, 2009

(30) Foreign Application Priority Data
Mar. 12, 2008 (KR) .................. 10-2008-0023062

(51) Int. Cl.
*H01L 29/66* (2006.01)
(52) U.S. Cl. .......... 257/409; 257/E29.018; 257/E27.013
(58) Field of Classification Search ................... 257/321, 257/501, E29.3, E27.013, E29.018, 294, 257/340, 409
See application file for complete search history.

(56) References Cited

U.S. PATENT DOCUMENTS
| 6,613,633 B2 | 9/2003 | Oh |
| 2005/0167749 A1 | 8/2005 | Disney |
| 2006/0192255 A1* | 8/2006 | Kim et al. .................. 257/382 |

FOREIGN PATENT DOCUMENTS
KR 10-1999-0081054 A 11/1999
KR 10-0302611 B1 7/2001

* cited by examiner

*Primary Examiner* — Thomas L. Dickey
*Assistant Examiner* — Nikolay Yushin
(74) *Attorney, Agent, or Firm* — Lee & Morse, P.C.

(57) ABSTRACT

A semiconductor device includes a substrate having a first area and a second area, a first transistor in the first area, a second transistor in the second area, an isolation layer between the first area and the second area, and at least one buried shield structure on the isolation layer.

18 Claims, 25 Drawing Sheets

SEMICONDUCTOR DEVICE

BACKGROUND

1. Field

Example embodiments relate to a semiconductor device and a method of manufacturing a semiconductor device. More particularly, example embodiments relate to a nonvolatile semiconductor device including a buried shield structure, and a method of manufacturing a nonvolatile semiconductor device having a buried shield structure.

2. Description of the Related Art

Semiconductor memory devices are generally used to store desired data therein and to read the stored data. The semiconductor memory devices are usually classified into volatile semiconductor memory devices and nonvolatile semiconductor memory devices. The volatile semiconductor memory device lose the stored data when an applied power is off, while the nonvolatile semiconductor memory devices maintain the stored data even though a power applied thereto is off.

A flash memory device, one of electrically erasable programmable read only memory (EEPROM) devices, has been widely employed in various electronic apparatuses such as a cellular phone, a digital camera, a portable multimedia player, a USB memory device, etc. Data may be stored into the flash memory device or may be erased from the flash memory device through a Fowler-Nordheim tunneling process or a hot electron injection process.

FIG. 1 illustrates a circuit diagram of a conventional flash memory device. Referring to FIG. 1, the conventional flash memory device 11 generally includes a row decoder 12, a memory cell array 13, a sense amplifier 14 and a source line driver (not shown).

When the flash memory device 11 is a NAND type memory device, the memory cell array 13 of the flash memory device 11 includes a plurality of word lines WL1, WL2, WL3, WL4, WL5, WL6, WL7 and WL8, a plurality of bit lines BL1, BL2 and BLn, a plurality of string memory cells MT, and selection transistors ST1 and ST2. The string memory cells MT and the selection transistors ST1 and ST2 are electrically connected to the word lines and the bit lines.

The row decoder 12 includes the word lines WL1 to WL8 and selection gate lines SGD and SGS. The row decoder 12 further includes peripheral circuit decoders 16 and 17. The sense amplifier 14 can read data stored in a selected memory cell, and then can amplify the data of the selected memory cell. The source line driver 15 can supply source lines with a power.

The peripheral circuit decoder 17 includes high voltage transistors TR1, TR2, TR3, TR4, TR5, TR6, TR7 and TR8, whereas the memory cell array 13 has cell transistors operated with a common voltage. Since the flash memory device 11 occasionally requires a high operation voltage, the high voltage transistors and the cell transistors are simultaneously used in the flash memory device 11.

FIG. 2 illustrates a cross-sectional view of a conventional NAND type flash memory device.

Referring to FIG. 2, the NAND type flash memory device is formed on a substrate 10 having a cell transistor area A and a high voltage transistor area B. Cell transistors are provided in the cell transistor area A. Each of the cell transistors includes a first gate oxide layer 17, a first gate electrode 19, and a gate mask 21. The cell transistors are isolated by a first isolation layer 14. High voltage transistors are provided in the high voltage transistor area B. Each of the high voltage transistors includes a second gate oxide layer 18 and a second gate electrode 23. The high voltage transistors are separated by a second isolation layer 15. An insulating interlayer 24 covers the cell transistor and the high voltage transistors.

In the conventional flash memory device, electrical insulation between an isolation layer, a high voltage transistor, and a cell transistor may be easily broken when a high voltage is applied to the high voltage transistor in an operation of the flash memory device. Due to such a breakdown of electrical insulation, a punch-through leakage may be caused, thereby deteriorating electrical characteristics of the flash memory device.

Although the second isolation layer 15 shown in FIG. 2 is relatively deep in an attempt to ensure electrical insulation between the cell transistor and the high voltage transistor, processes for forming the first and the second isolation layers 14 and 15 on the substrate 10 may be considerably complicated, because the dimensions of the first isolation layer 14 are quite different from those of the second isolation layer 15. Additionally, the size of the flash memory device may be increased when the second isolation layer 15 has a large width and depth. Furthermore, the flash memory device may not properly operate in a reading operation and an erasing operation because the first and the second isolation layers 14 and 15 have considerably different dimensions.

SUMMARY

Example embodiments are therefore directed to providing a semiconductor device and a method of making a semiconductor device, which substantially overcome one or more of the problems associated with the related art.

It is therefore an aspect of embodiments to provide a semiconductor device including a buried shield structure between a cell area and a high voltage area.

It is another aspect of embodiments to provide a semiconductor device having a greater breakdown voltage.

It is yet another aspect of embodiments to provide a semiconductor device having a greater degree of integration.

It is still another aspect of embodiments to provide a method of manufacturing a semiconductor device having a buried shield structure through a simplified process.

At least one of the above and other aspects and advantages may be realized by providing a semiconductor device including a first transistor, a second transistor, an isolation layer and at least one buried shield structure. The first transistor is in a first area of a substrate. The second transistor is in a second area of the substrate. The isolation layer is between the first area and the second area. The buried shield structure is on the isolation layer.

In example embodiments, the first transistor may include a cell transistor and the second transistor may include a high voltage transistor In example embodiments, the buried shield structure may include a first pattern, a second pattern, and a third pattern sequentially formed on the isolation layer. Each of the first and the second patterns may include polysilicon, metal, and/or metal compound. For example, each of the first and the second patterns may include polysilicon doped with impurities, tungsten, titanium, aluminum, tantalum, tungsten nitride, tungsten silicide, titanium nitride, titanium silicide, aluminum nitride, titanium aluminum nitride, tantalum nitride, cobalt silicide, zirconium silicide, etc. These may be used alone or in a mixture thereof.

In example embodiments, the buried shield structure may additionally include a sidewall spacer on sidewalls of the first to the third patterns.

In example embodiments, the third pattern may include silicon oxide, silicon nitride, and/or carbon.

In example embodiments, a plurality of buried shield structures may be on the isolation layer between the first and the second areas.

In example embodiments, the first transistor may include a tunnel insulation layer, a floating gate, a first dielectric layer pattern, and a control gate structure having a plurality of control gates. Further, the second transistor may include a gate insulation layer, a lower electrode, a second dielectric layer pattern, and an upper electrode structure having a plurality of upper electrodes. Here, the upper electrode structure may make contact with the lower electrode through the second dielectric layer.

At least one of the above and other aspects may be realized by providing a semiconductor device including a substrate having a first area and a second area, a plurality of cell transistors formed in the first area, a plurality of high voltage transistors formed in the second area, and at least one buried shield structure disposed between adjacent high voltage transistors.

At least one of the above and other aspects may be realized by providing a method of manufacturing a semiconductor device. In the method of manufacturing the semiconductor device, an isolation layer may be formed between a first area and a second area after providing a substrate having the first and the second areas. A first transistor may be formed in the first area and a second transistor may be formed in the second area. At least one buried shield structure may be formed on the isolation layer.

In the formation of the buried shield structure according to example embodiments, a recess may be formed between the first and the second areas by partially etching the isolation layer. A first conductive layer may be formed in the recess, and then a second conductive layer may be formed on the first layer. A mask may be formed on the second conductive layer. A first pattern and a second pattern may be formed by etching the first the second conductive layers using the mask. A third pattern may be formed on the second pattern by partially removing the mask. A sidewall spacer may be additionally on a sidewall of the buried shield structure.

In the formation of the first transistor according to example embodiments, a tunnel insulation layer may be formed in the first area. A floating gate may be formed on the tunnel insulation layer. A first dielectric layer pattern may be formed on the floating gate. A control gate structure having a plurality of control gates may be formed on the first dielectric layer pattern. In the formation of the second transistor, a gate insulation layer may be formed in the second area. A lower electrode may be formed on the gate insulation layer, and then a second dielectric layer pattern may be formed on the lower electrode. An upper electrode structure may be formed on the second dielectric layer pattern. The upper electrode structure may have a plurality of upper electrodes and may make contact with the lower electrode.

In example embodiments, the first and the second patterns, the control gate structure and the upper electrode structure may be simultaneously formed.

In example embodiments, an insulation layer pattern may be additionally formed between adjacent first transistors in the first area while forming the recess.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
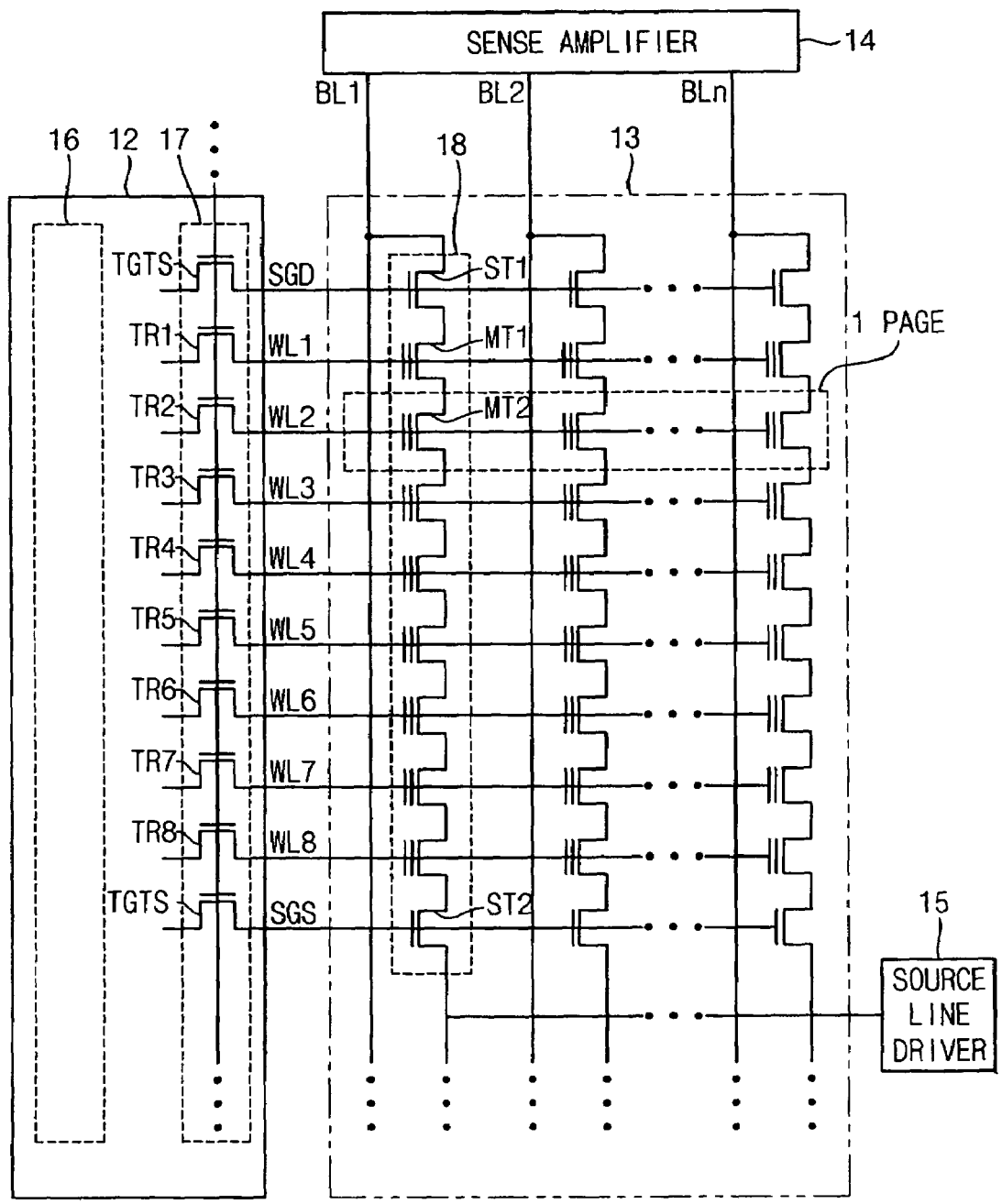
FIG. 1 illustrates a circuit diagram of a conventional flash memory device.
Figure 2:
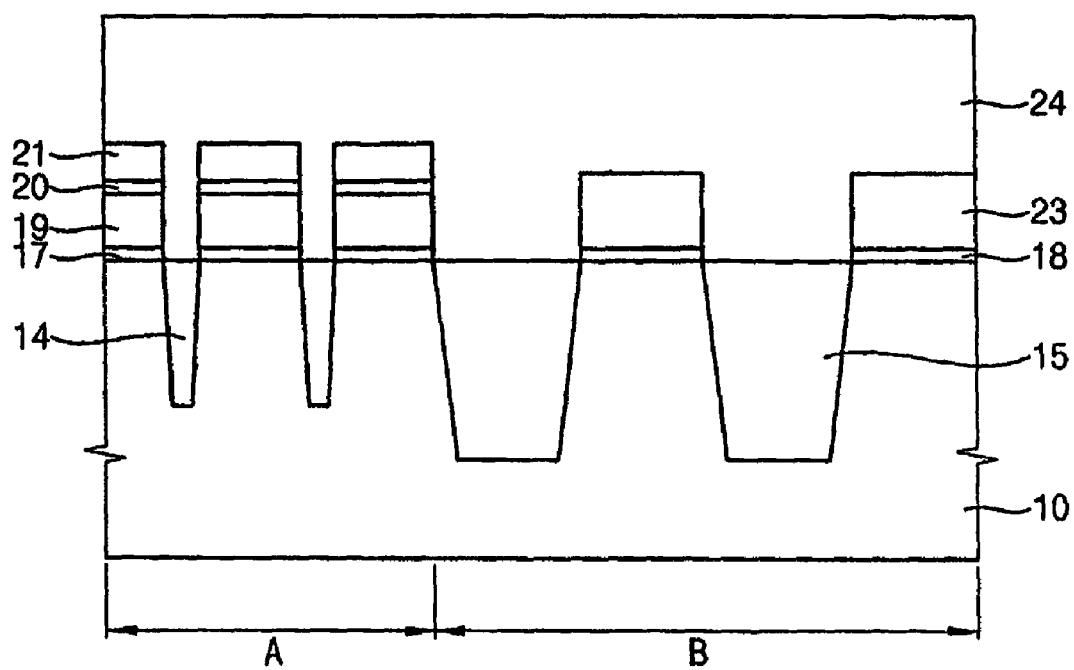
FIG. 2 illustrates a cross-sectional view of a conventional NAND type flash memory device.
Figure 2:
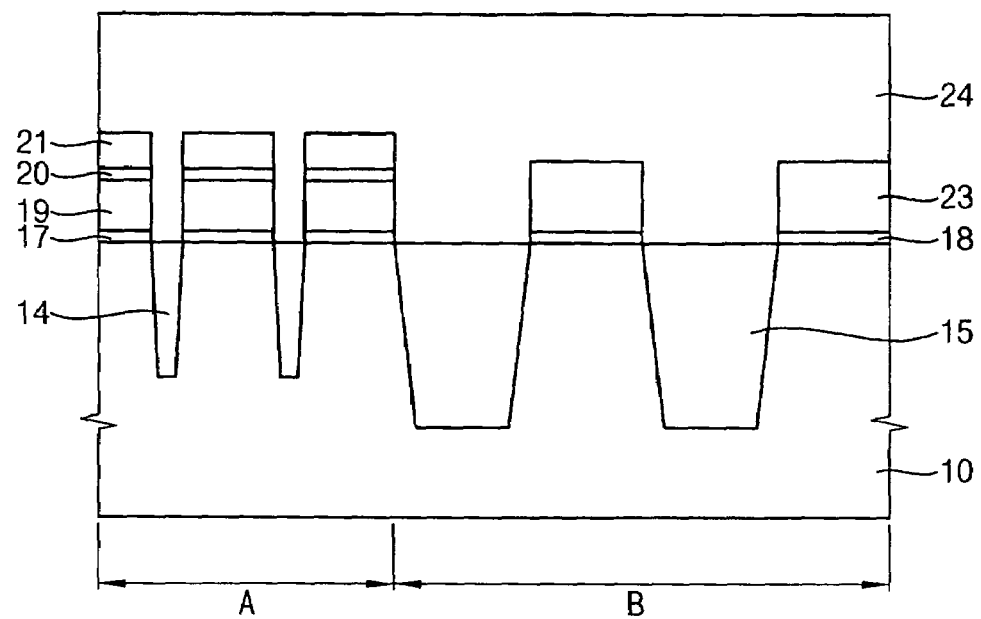

Korean Patent Application No. 2008-0023062, filed on Mar. 12, 2008, in the Korean Intellectual Property Office, and entitled: "Semiconductor Device and Method of Manufacturing a Semiconductor Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third, etc., may be used herein to describe various elements, components, regions, layers, patterns and/or sections, these elements, components, regions, layers, patterns and/or sections should not be limited by these terms. These terms are only used to distinguish one element, component, region, layer, pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of illustratively idealized example embodiments (and intermediate structures) of the invention. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to example embodiments, discussed in detail below, a semiconductor device may include at least one buried shield structure formed on a predetermined portion of the substrate. The buried shield structure may be positioned adjacent to a high voltage transistor of the semiconductor device or may be located between the high voltage transistor and a cell transistor of the semiconductor device. Such a semiconductor device may have improved electrical characteristics without electrical failure such as breakdown, leakage current, etc. Additionally, such a semiconductor device may ensure a high integration degree due to the buried shield structure. Furthermore, a semiconductor device including buried shield structure may be easily manufactured by simplified processes because the buried shield structure may be formed together with the cell transistors and the high voltage transistors.

FIGS. 3 to 18 illustrate cross-sectional views of stages in a method of manufacturing a semiconductor device in accordance with example embodiments. In FIGS. 3 to 18, "I" represents a first area of a substrate 100 and "II" indicates a second area of the substrate 100. For example, first transistors, e.g., cell transistors of a memory cell array, may be formed in the first area I of the substrate 100, and second transistors, e.g., high voltage transistors of a peripheral circuit decoder, may be formed in the second area II of the substrate 100. Although FIGS. 3 to 18 illustrate a method of manufacturing a flash memory device, the features and advantages of the invention may be employed in other nonvolatile semiconductor devices or volatile semiconductor devices.

Figure 3:
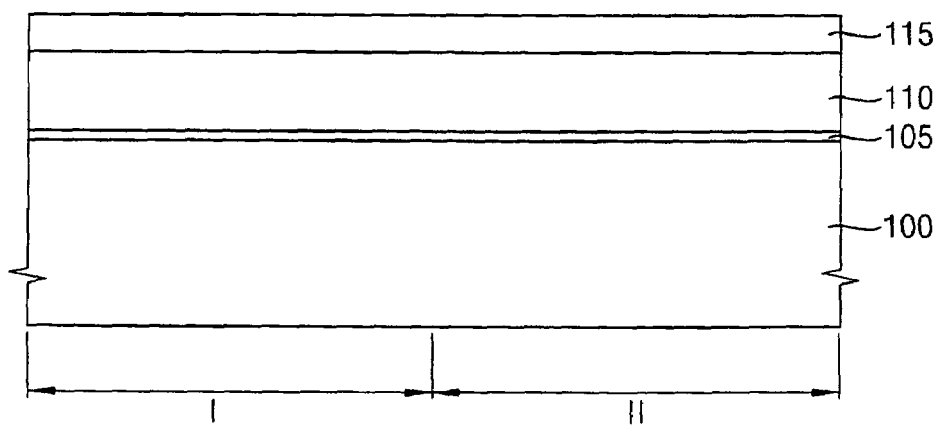
FIGS. 3 to 18 illustrate cross-sectional view of stages in a method of manufacturing a semiconductor device in accordance with example embodiments.

Referring to FIG. 3, a first insulation layer 105 may be formed on the substrate 100 having the first and the second areas I and II. The first insulation layer 105 may correspond to a tunnel insulation layer when a flash memory device is to be provided on the substrate 100.

The substrate 100 may include a semiconductor substrate, e.g., a single crystalline silicon (Si) substrate, a single crystalline germanium (Ge) substrate, a silicon-germanium (Si—Ge) substrate, etc. The substrate 100 may include a silicon-on-insulator (SOI) substrate, a germanium-on-insulator (GOI) substrate, etc.

In example embodiments, impurities may be doped into the first and the second areas I and II to form desired wells in the substrate 100 in accordance with electrical characteristics of cell transistors and high voltage transistors to be formed thereon. For example, P type and N type impurities may be implanted into the first and the second areas I and II to form a P type well and an N type well in the first area I and the second area II, respectively.

The first insulation layer 105 may include an oxide and/or a metal oxide. For example, the first insulation layer 105 may be formed using silicon oxide (SiOx), hafnium oxide (HfOx), zirconium oxide (ZrOx), tantalum oxide (TaOx), aluminum oxide (AlOx), etc. These may be used alone or in a mixture thereof. The first insulation layer 105 may be formed by a radical oxidation process, a chemical vapor deposition (CVD) process, an atomic layer deposition (ALD) process, a sputtering process, a pulsed laser deposition (PLD) process, etc.

In example embodiments, the first insulation layer 105 may have a thickness of about 50 Å to about 100 Å based on an upper face of the substrate 100 in case that the first insulation layer 105 serves as the tunnel insulation layer in the flash memory device. When the first insulation layer 105 is obtained by the radical oxidation process, the first insulation layer 105 may sufficiently ensure a desired structure and electrical characteristics for the tunnel insulation layer in the flash memory device.

A first conductive layer 110 may be formed on the first insulation layer 105. The first conductive layer 110 may be formed using polysilicon, a metal, and/or a metal compound. For example, the first conductive layer 110 may include polysilicon doped with impurities, a metal such as tungsten (W), titanium (Ti), aluminum (Al), tantalum (Ta), etc., a metal compound such as tungsten nitride (WNx), tungsten silicide (WSix), titanium nitride (TiNx), titanium silicide (TiSix), aluminum nitride (AlNx), titanium aluminum nitride (TiAlxNy), tantalum nitride (TaNx), cobalt silicide (CoSix), zirconium silicide (ZrSix), etc. These may be used alone or in a mixture thereof. The first conductive layer 110 may be formed by a CVD process, an ALD process, a plasma enhanced chemical vapor deposition (PECVD) process, a sputtering process, a PLD process, an evaporation process, etc. In one example embodiment, the first conductive layer 110 may be formed by a PECVD process using polysilicon when the flash memory device is to be formed on the substrate 100.

In example embodiments, the first conductive layer 110 may be patterned to form a floating gate 111 (see FIG. 4) in the cell transistor of the flash memory device. The first conductive layer 110 may have a thickness of about 500 Å to about 1,500 Å measured from an upper face of the first insulation layer 105. In forming the first conductive layer 110, a first conductive film may be formed on the first insulation layer 105 and a second conductive film may be formed on the first conductive film. That is, the first conductive layer 110 may have a multilayer structure to ensure improved electrical characteristics. Here, the first conductive film may have a thickness of about 200 Å to about 500 Å and the second conductive film may have a thickness of about 300 Å to about 1,000 Å.

A hard mask layer 115 may be provided on the first conductive layer 110. The hard mask layer 115 may be formed using a material that has an etching selectivity relative to the first conductive layer 110, the first insulation layer 105, and the substrate 100. For example, the hard mask layer 115 may include a nitride, e.g., silicon nitride (SiNx), or an oxynitride, e.g., silicon oxynitride (SiOxNy) or titanium oxynitride (TiOxNy). Alternatively, the hard mask layer 115 may have a multilayer structure that includes an oxide film, a nitride film, an organic material film, and/or an oxynitride film. For example, the hard mask layer 115 may include an oxide film, a lower nitride film, an organic material film and an upper nitride film.

Figure 4:
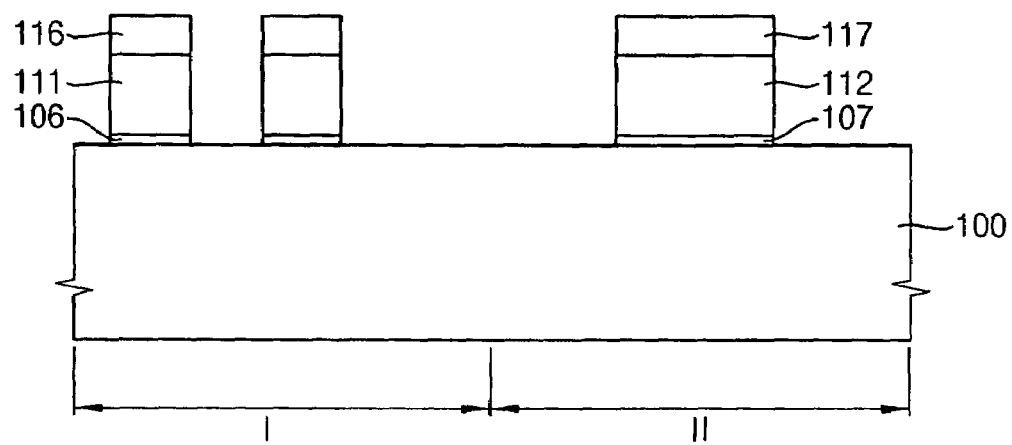

Referring to FIG. 4, a first hard mask 116 and a second hard mask 117 may be provided on the first conductive layer 110, e.g., by partially etching the hard mask layer 115. The first hard mask 116 may be located in the first area I of the substrate 100. The second hard mask 117 may be located in the second area II of the substrate 100. The second hard mask 117 may have a width substantially larger than that of the first hard mask 116 when the high voltage transistor is to be formed in the second area II of the substrate 100. The first and the second hard masks 116 and 117 may be obtained on the first conductive layer 110 by a photolithography process.

Using the first and the second hard masks 116 and 117 as etching masks, the first conductive layer 110 and the first insulation layer 105 may be partially etched. Thus, the floating gate 111, a lower electrode 112, a tunnel insulation layer 106, and a gate insulation layer 107 are formed on the substrate 100. Here, the tunnel insulation layer 106 and the floating gate 111 may be provided in the first area I, whereas the gate insulation layer 107 and the lower electrode 112 may be provided in the second area II. Therefore, a first conductive structure and a second conductive structure are provided in the first area I and the second area II, respectively. The first conductive structure may include the tunnel insulation layer 106, the floating gate 111, and the first hard mask 116. The second conductive structure may include the gate insulation layer 107, the lower electrode 112, and the second hard mask 117. The first and the second hard masks 116 and 117 may be removed from the first and the second conductive structures as occasion demands.

In example embodiments, the tunnel insulation layer 106 and the floating gate 111 may have widths substantially smaller than those of the gate insulation layer 107 and the lower electrode 112, respectively. Further, the floating gate 111 and the lower electrode 112 may be simultaneously formed by performing one etching process even though the floating gate 111 may have dimensions substantially different from those of the lower electrode 112. Thus, processes for manufacturing the semiconductor device, e.g., the flash memory device, may be simplified.

Figure 5:
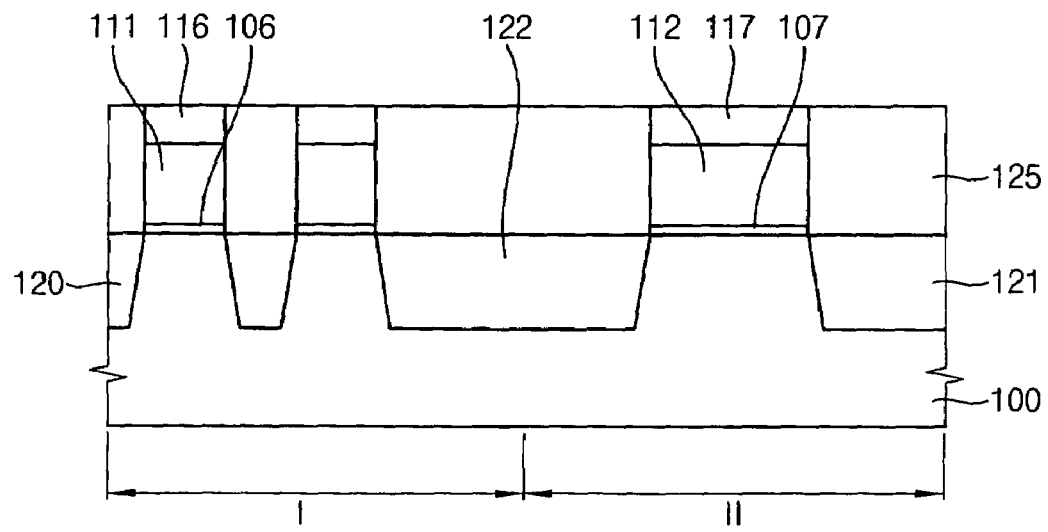

Referring to FIG. 5, the substrate 100 may be partially etched using the first and the second conductive structures as etching masks, so that a first trench (filled), a second trench (filled), and a third trench (filled) are formed on the substrate 100. The first trench may be between adjacent first conductive structures in the first area I. The second trench may be between adjacent second conductive structures in the second area II. Further, the third trench may be between the first area I and the second area II. That is, the third trench may be located between an outermost first conductive structure and an outermost second conductive structure. The second trench may have a width substantially larger than that of the first trench and the third trench may have a width substantially the same as or substantially similar to that of the second trench. Hence, the width of the third trench may be substantially wider than that of the first trench. However, the first trench may have a depth substantially the same as, or substantially similar to, those of the second and the third trenches.

In example embodiments, each of the first to the third trenches may have an inclined sidewall with respect to the substrate 100. When the first to the third trenches have the inclined sidewalls, stresses generated between the substrate 100 and an isolation layer or isolation layer patterns may be reduced. Each of the first to the third trenches may have a depth of about 2,000 Å to about 4,000 Å measured from the upper face of the substrate 100. However, the depths of the first to the third trenches may vary in accordance with electrical characteristics and/or dimensions of the flash memory device to be formed.

A first isolation layer 120, a second isolation layer 121, and a third isolation layer 122 may be formed on the substrate 100 to fill up the first trench, the second trench, and the third trench, respectively. Each of the first to the third isolation layers 120, 121 and 122 may be formed by a shallow trench isolation (STI) process, a thermal oxidation process, a CVD process, a high density plasma-chemical vapor deposition (HDP-CVD) process, etc. Additionally, the first to the third isolation layers 120, 121 and 122 may be formed using an oxide, e.g., undoped silicate glass (USG), spin on glass (SOG), phosphor silicate glass (PSG), boro-phosphor silicate glass (BPSG), flowable oxide (FOX), tonen silazene (TOSZ), tetraethyl ortho silicate (TEOS), plasma enhanced-tetraethyl ortho silicate (PE-TEOS), HDP-CVD oxide, etc. These may be used alone or in a mixture thereof.

In example embodiments, the first isolation layer 120 may electrically insulate adjacent cell transistors in the first area I, and the second isolation layer 121 may electrically insulate adjacent high voltage transistors in the second area II. Further, the third isolation layer 122 may electrically insulate the cell transistor from the high voltage transistor between the first and the second areas I and II.

After a second insulation layer 125 is formed on the substrate 100 to cover the first and the second conductive structures, the second insulation layer 125 may be partially removed until the first and the second hard masks 116 and 117 are exposed. The second insulation layer 125 may be partially removed by a chemical mechanical polishing (CMP) process and/or an etch-back process. The second insulation layer 125 may be formed using an oxide, e.g., silicon oxide. Examples of silicon oxide in the second insulation layer 125 may include HDP-CVD oxide, USG, SOG, PSG, BPSG, FOX, TOSZ, TEOS, PE-TEOS, etc. Further, the second insulation layer 125 may be obtained by a CVD process, a low pressure chemical vapor deposition (LPCVD) process, a spin coating process, a PECVD process, an HDP-CVD process, etc.

In example embodiments, field impurities may be doped into portions of the substrate 100 where the first to the third trenches are to be formed before forming the first to the third trenches on the substrate 200. Thus, electrical insulation characteristics of the first to the third isolation layers 120, 121 and 122 may be enhanced due to the field impurities.

Figure 6:
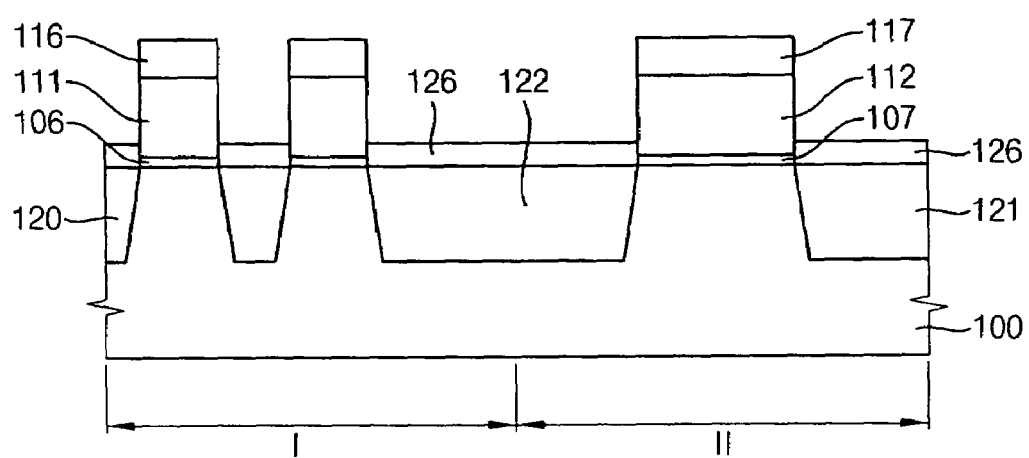

Referring to FIG. 6, the second insulation layer 125 may be etched to form an upper insulation layer 126 on the substrate 100. The upper insulation layer 126 may cover lower sidewalls of the floating gate 111 and the lower electrode 112 in the first and the second areas I and II. Further, the upper insulation layer 126 may cover the third isolation layer 122 filling the third trench between the first and the second areas I and II. After the formation of the upper insulation layer 126, sidewalls of the first and the second conductive structures may be exposed in the first and the second areas I and II.

Figure 7:
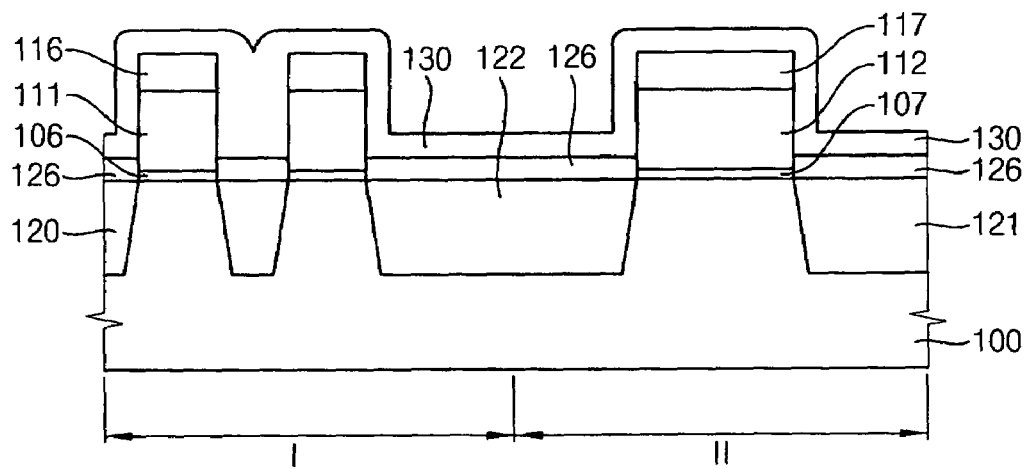

Referring to FIG. 7, a spacer formation layer 130 may be formed on the upper insulation layer 126 to cover the first and the second conductive structures in the first and the second areas I and II. The spacer formation layer 130 may be formed using an oxide or an oxynitride. For example, the spacer formation layer 130 may include middle temperature oxide (MTO) or silicon oxynitride. Further, the spacer formation layer 130 may be formed by a CVD process, an LPCVD process, a PECVD process, an HDP-CVD process, etc.

In example embodiments, a gap between adjacent first conductive structures in the first area I may be filled with the spacer formation layer 130 when the spacer formation layer 130 has a sufficient thickness. For example, the gap between adjacent first conductive structures may be filled when the spacer formation layer 130 has a thickness substantially larger than a half of a width of the gap between adjacent first conductive structures in the first area I. When the spacer formation layer 130 fills up the gap between adjacent first conductive structures in the first area I, a recess 134 (see FIG. 8) may be formed between the first area I and the second area II by etching the spacer formation layer 130.

Figure 8:
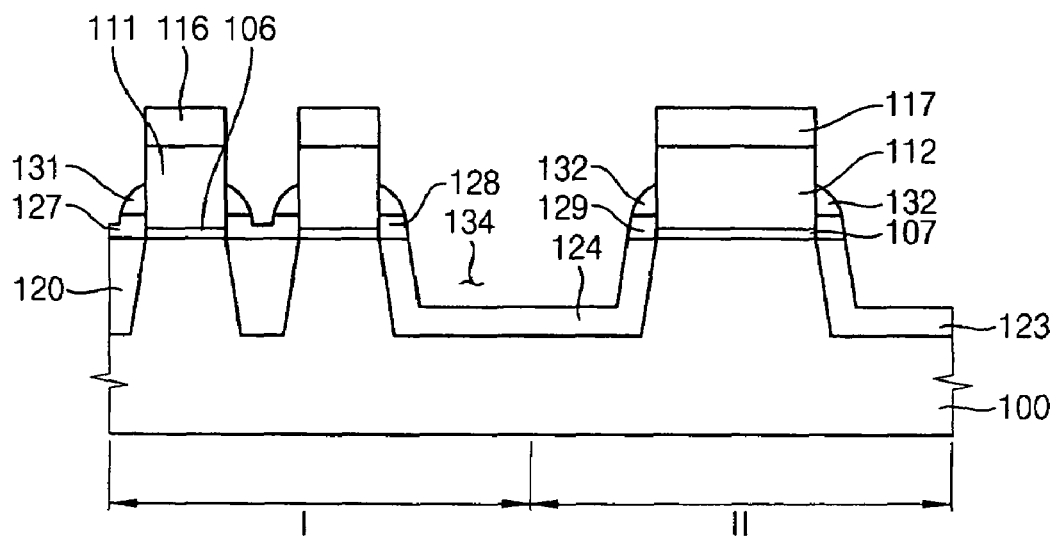

Referring to FIG. 8, the spacer formation layer 130 may be etched to form a first spacer 131 and a sacrificial spacer 132. The first and the sacrificial spacers 131 and 132 may be positioned to enclose the lower sidewalls of the first and the second conductive structures, respectively. While etching the spacer formation layer 130, the second isolation layer 121 and the third isolation layer 122 may be partially etched, so that a second isolation layer pattern 123 and a third isolation layer pattern 124 are formed in the second trench and the third trench, respectively. Further, the upper insulation layer 126 may be simultaneously etched to form a first upper insulation layer pattern 127, a second upper insulation layer pattern 129, and a third upper insulation layer pattern 128. The second and the third isolation layer patterns 123 and 124 may be positioned on lower faces and sidewalls of the second and the third trenches, respectively.

In example embodiments, the first upper insulation layer pattern 127 may be positioned between adjacent first conductive structures in the first area I. Further, the first upper insulation layer pattern 127 may cover the first isolation layer 120 and the first spacer 131. Lateral portions of the first upper insulation layer pattern 127 may be positioned beneath adjacent first spacers 131, whereas a central portion of the first upper insulation layer pattern 127 may be exposed between adjacent first spacers 131. Since the spacer formation layer 130 has a thickness sufficient to fill up the gap between the first conductive structures in the first area I, the first upper insulation layer pattern 127 may have a dent or a recess at the central portion thereof after etching the spacer formation layer 130.

One of lateral portions of the second upper insulation layer pattern 129 may be formed between the second isolation layer pattern 123 and the sacrificial spacer 132. The other of the lateral portions of the second upper insulation layer pattern 129 may be positioned between the third isolation layer pattern 124 and the sacrificial spacer 132 formed on a lower sidewall of the outermost second conductive structure in the second area II. The third upper insulation layer pattern 128 may be also formed between the third isolation layer pattern 124 and the first spacer 131 positioned on a lower sidewall of the outermost first conductive structure in the first area I.

In example embodiments, each of the second and the third upper insulation layer patterns 129 and 128 may have a width substantially the same as, or substantially similar to, those of the first and the sacrificial spacers 131 and 132. Further, each of the second and the third isolation layer patterns 123 and 124 may have a width substantially the same as, or substantially similar to, those of the second and the third upper insulation layer patterns 129 and 128.

In example embodiments, the first and the sacrificial spacers 131 and 132 may increase a coupling ratio of the flash memory device. The coupling ratio of the flash memory device may mainly depend on the amount of charge between the floating gate 111 and a control gate structure 170 (see FIG. 15) of the flash memory device. Thus, the coupling ratio of the flash memory device may increase accordingly as an area between the floating gate 111 and the control gate structure 170 increases. When the first and the sacrificial spacers 131 and 132 are positioned on the lower sidewalls of the first and the second conductive structures, the flash memory device may have an increased coupling ratio in comparison with that of the conventional flash memory device.

Figure 9:
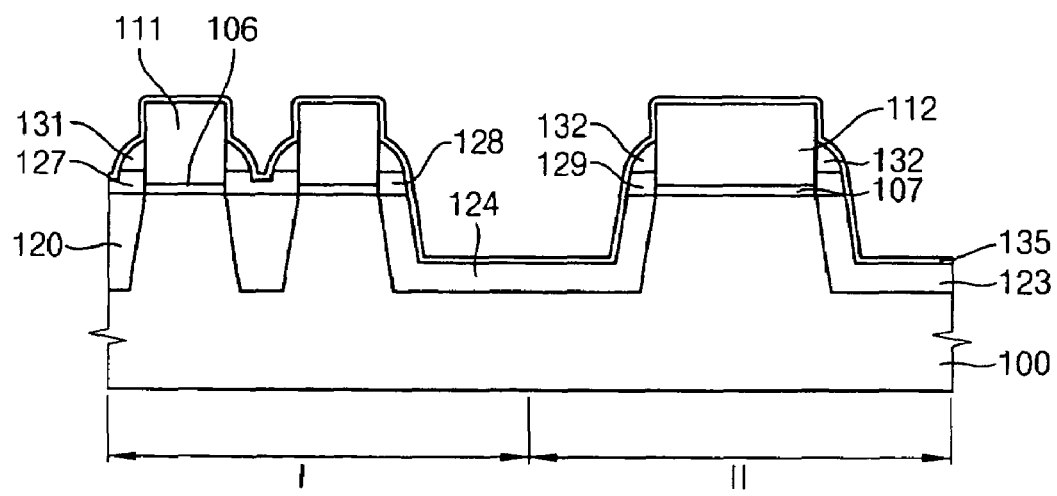

Referring to FIG. 9, a dielectric layer 135 may be formed on the resultant structures to cover the floating gate 111 and the lower electrode 112 after removing the first and the second masks 116 and 117 from the floating gate 111 and the lower electrode 112. In addition, the dielectric layer 135 may cover the first spacer 131, the sacrificial spacer 132, and the first to the third upper insulation layer patterns 127, 129 and 128.

In example embodiments, the dielectric layer 135 may be formed using a material that increases the coupling ratio of the flash memory device. When the dielectric layer 135 includes a material having a dielectric constant substantially larger than those of the tunnel insulation layer 106 and the gate insulation layer 106, the flash memory device may have a considerably increased coupling ratio. Therefore, the dielectric layer 135 may be formed using a metal compound, e.g., hafnium oxide (HfOx), aluminum oxide (AlOx), tantalum oxide (TaOx), zirconium oxide (ZrOx), etc. Alternatively, the dielectric layer 135 may have a multilayer structure that includes a lower oxide film, a nitride film and an upper oxide film. The dielectric layer 135 may have a thickness of about 100 Å to about 200 Å. The dielectric layer 135 may be conformally formed along profiles of the resultant structures on the substrate 100.

Figure 10:
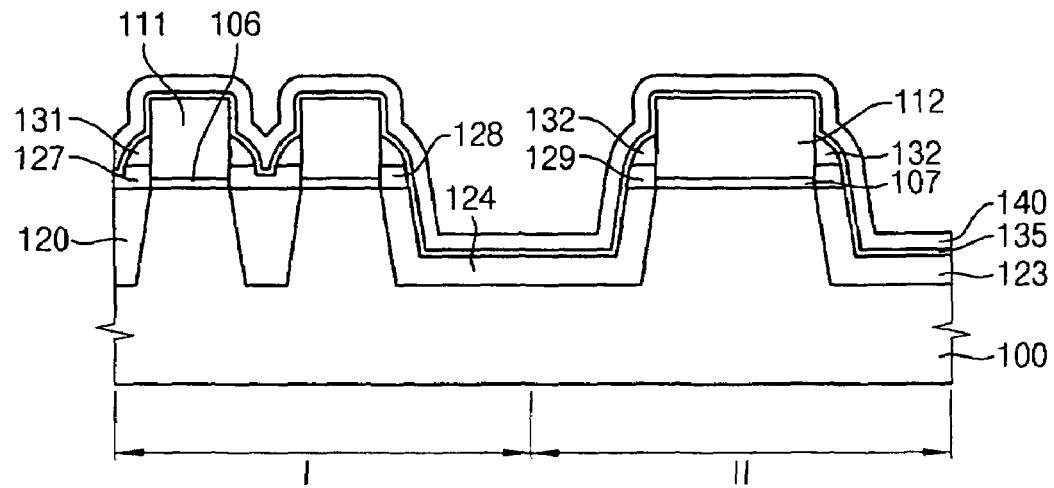

Referring to FIG. 10, a second conductive layer 140 may be formed on the dielectric layer 135. The second conductive layer 140 may also be conformally formed on the dielectric layer 135 along the profiles of the resultant structures on the substrate 100. The second conductive layer 140 may be formed using polysilicon, a metal, and/or a metal compound. For example, the second conductive layer 140 may include polysilicon doped with impurities, tungsten, titanium, aluminum, tantalum, tungsten nitride, tungsten silicide, titanium nitride, titanium silicide, aluminum nitride, titanium aluminum nitride, tantalum nitride, cobalt silicide, zirconium silicide, etc. These may be used alone or in a mixture thereof. Further, the second conductive layer 140 may be formed by a CVD process, an ALD process, a PECVD process, a sputtering process, a PLD process, an evaporation process, etc. The second conductive layer 140 may have a thickness of about 500 Å to about 1,000 Å based on an upper face of the dielectric layer 135. In one example embodiment, the second conductive layer 140 may be formed using polysilicon by a PECVD process.

Figure 11:
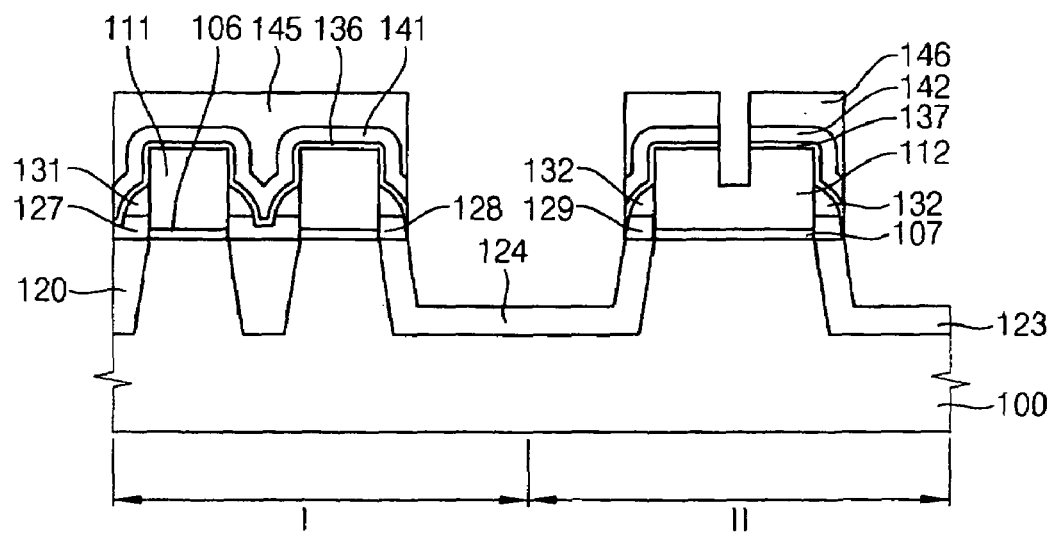

Referring to FIG. 11, a first butting mask 145 and a second butting mask 146 may be provided on the second conductive layer 140 in the first and the second areas I and II. The first butting mask 145 may cover the first conductive structures in the first area I. The second butting mask 146 may partially cover the second conductive structures in the second area II, e.g., a central portion of the second conductive structure may be exposed through the second butting mask 146. That is, a portion of the second conductive layer 140 may be exposed by the second butting mask 146. Further, a portion of the second conductive layer 140 between the first and the second areas I and II may be exposed after formation of the first and the second butting masks 145 and 146. Particularly, the portion of the second conductive layer 140 over the third isolation layer pattern 124 may be exposed when the first and the second butting masks 145 and 146 are formed.

Using the first and the second butting masks 145 and 146 as etching masks, the second conductive layer 140 and the dielectric layer 135 may be partially removed from the third isolation layer pattern 124. Further, portions of the second conductive layer 140, the dielectric layer 135, and the lower electrode 112 in the second area II may be etched while partially removing the second conductive layer 140 and the dielectric layer 135. Hence, a first dielectric layer pattern 136 and a first control gate 141 may be formed in the first area I, and a preliminary second dielectric layer pattern 137 and a first upper electrode 142 may be provided in the second area II. When the lower electrode 112 is partially etched, a dent or a recess may be provided on the lower electrode 112.

In example embodiments, the first dielectric layer pattern 136 may cover the floating gate 111, the first spacer 131, and the first insulation layer pattern 127 in the first area I. Further, the first dielectric layer pattern 136 may cover all of the floating gates, the first spacers, and the first insulation layer pattern in the first area I. That is, the cell transistors in the first area I may share one common first dielectric layer pattern 136. Similarly, the cell transistors may also share one first control gate 141 formed on the first dielectric layer pattern 136. However, the high voltage transistors in the second area II may not share one common dielectric layer pattern. That is, the preliminary second dielectric layer pattern 137 may be separated from the adjacent preliminary second dielectric layer pattern. The preliminary second dielectric layer pattern 137 may cover the sacrificial spacer 132 and the lower electrode 112, and the first upper electrode 142 may be positioned on the preliminary second dielectric layer pattern 137.

In the reading and the erasing operations of the semiconductor device to be formed, the charges may not be stored into the lower electrode 112 of the second conductive structure, so that the lower electrode 112 and the first upper electrode 142 may make contact with upper electrodes successively formed.

Figure 12:
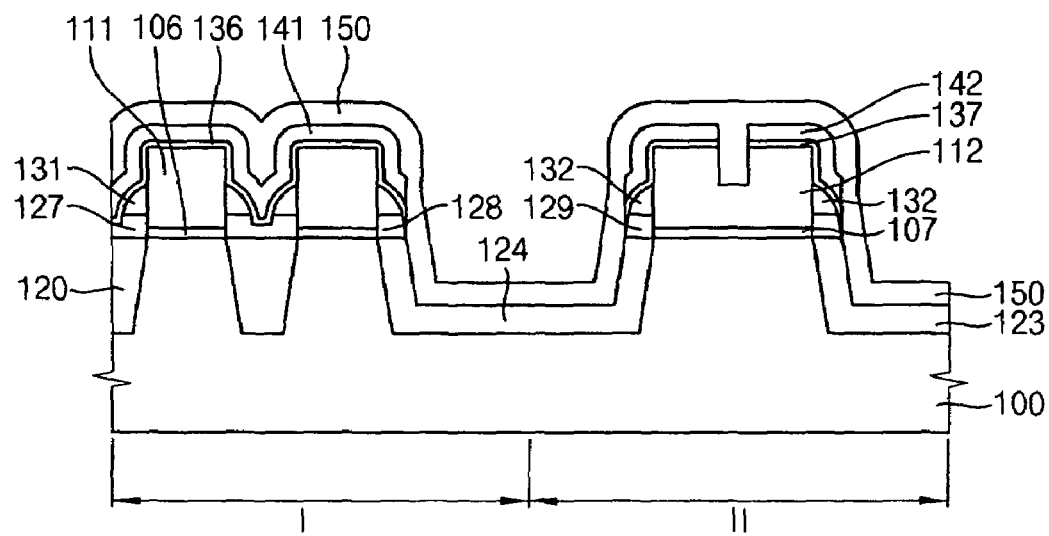

Referring to FIG. 12, the first and the second butting masks 145 and 146 may be removed from the first control gate 141 and the first upper electrode 142. Then, a third conductive layer 150 may be formed on the first control gate 141, the third isolation layer pattern 124, and the first upper electrode 142. The third conductive layer 150 may fill up the dent or the recess exposing the lower electrode 112, so that the third conductive layer 150 may make contact with the lower electrode 112.

The third conductive layer 150 may be formed using polysilicon, a metal and/or a metal compound. For example, the third conductive layer 150 may include polysilicon doped with impurities, tungsten, titanium, aluminum, tantalum, tungsten nitride, tungsten silicide, titanium nitride, titanium silicide, aluminum nitride, titanium aluminum nitride, tantalum nitride, cobalt silicide, zirconium silicide, etc. These may be used alone or in a mixture thereof. Additionally, the third conductive layer 150 may be formed by a CVD process, an ALD process, a PECVD process, a sputtering process, a PLD process, an evaporation process, etc. The third conductive layer 150 may have a thickness of about 500 Å to about 1,000 Å.

In example embodiments, the third conductive layer 150 may include a material substantially the same as or substantially similar to that of the second conductive layer 140 and/or that of the first conductive layer 110. Alternatively, the first to the third conductive layers 110, 140 and 150 may be formed using different materials, respectively.

Figure 13:
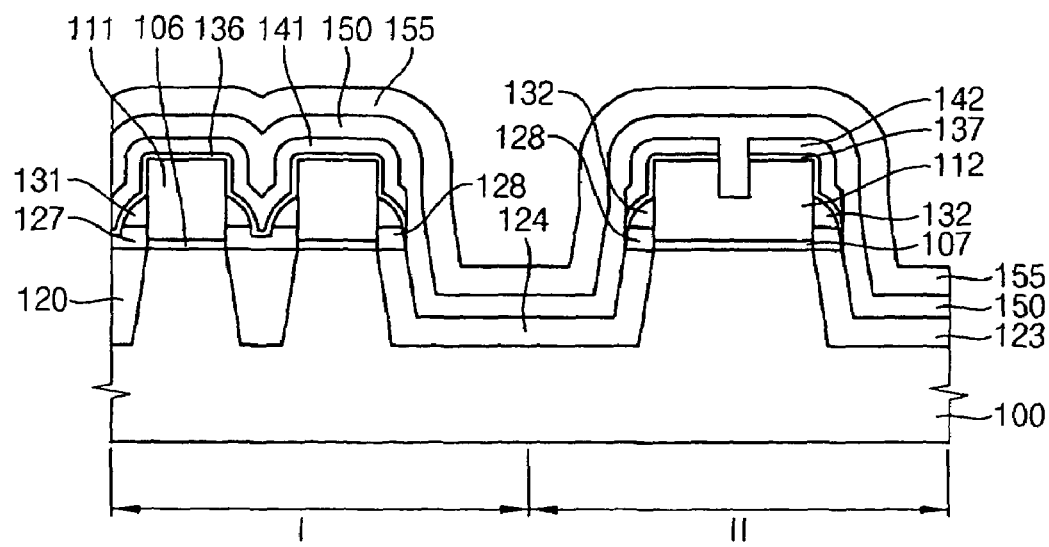

Referring to FIG. 13, a fourth conductive layer 155 may be formed on the third conductive layer 150. The third and the fourth conductive layers 150 and 155 may be conformally formed along profiles of the resultant structures on the substrate 100. The fourth conductive layer 155 may be formed using a metal and/or a metal compound. For example, the fourth conductive layer 155 may include tungsten, tungsten silicide, titanium, titanium silicide, cobalt silicide, zirconium silicide, etc. These may be used alone or in a mixture thereof. The fourth conductive layer 155 may be formed by a CVD process, a PECVD process, a sputtering process, a PLD process, an evaporation process, etc.

In one example embodiment, the fourth conductive layer 155 may have a multilayer structure that includes a tungsten film and a tungsten silicide film. The fourth conductive layer 155 may have a thickness of about 500 Å to about 1,000 Å measured from an upper face of the third conductive layer 150.

In example embodiments, a thermal treatment process may be performed about the substrate 100 having the fourth conductive layer 155, the third conductive layer 150, and the lower electrode 112. The thermal treatment process may improve adhesion strengths between the fourth conductive layer 155 and the third conductive layer 150, and between the fourth conductive layer 155 and the lower electrode 112. Further, contact resistances among the fourth conductive layer 155, the third conductive layer 150 and the lower electrode 112 may be reduced by the thermal treatment process. The thermal treatment process may be executed at a temperature below about 850° C. under an atmosphere including nitrogen.

Figure 14:
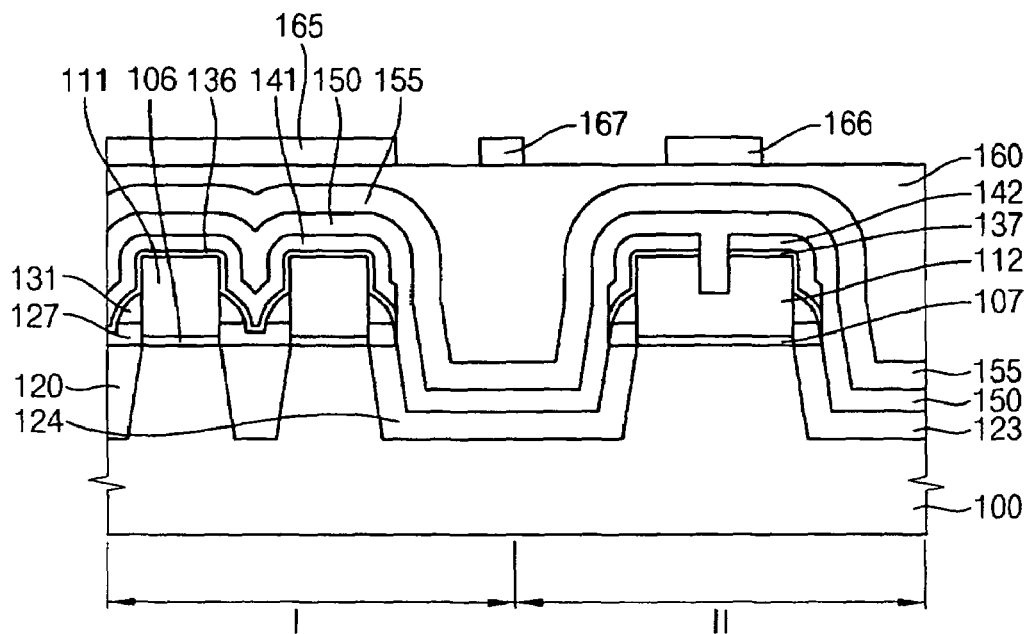

Referring to FIG. 14, a mask layer 160 may be formed on the fourth conductive layer 155. The mask layer 160 may have a sufficient thickness to completely fill up the recess 134 over the third isolation layer pattern 124 between the first and the second areas I and II. The mask layer 160 may be formed using an oxide, a nitride, and/or an organic material. For example, the mask layer 160 may include silicon oxide, silicon nitride, carbon, etc. Further, the mask layer 160 may be formed by a CVD process, a PECVD process, an HDP-CVD process, etc.

In example embodiments, the mask layer 160 may have a multilayer structure. For example, the mask layer 160 may include an oxide film, a carbon film, and a nitride film. The oxide film may have a thickness of about 2,000 Å to about 3,000 Å. The carbon film may also have a thickness of about 2,000 Å to about 3,000 Å. The nitride film may have a thickness of about 500 Å to about 1,000 Å. The nitride film may also serve as an antireflective layer. The mask layer 160 may be planarized by a planarization process to ensure a level upper face thereof. For example, the mask layer 160 may be planarized by a CMP process and/or an etch-back process.

A first photoresist pattern 165, a second photoresist pattern 166, and a third photoresist pattern 167 may be formed on the mask layer 160. The first to the third photoresist patterns 165, 166 and 167 may be formed by a photolithography process. The first photoresist pattern 165 may be on a first portion of the mask layer 160 in the first area I. The second photoresist pattern 166 may be on a second portion of the mask layer 160 in the second area II. The third photoresist pattern 167 may be on a third portion of the mask layer 160 between the first and the second areas I and II.

Figure 15:
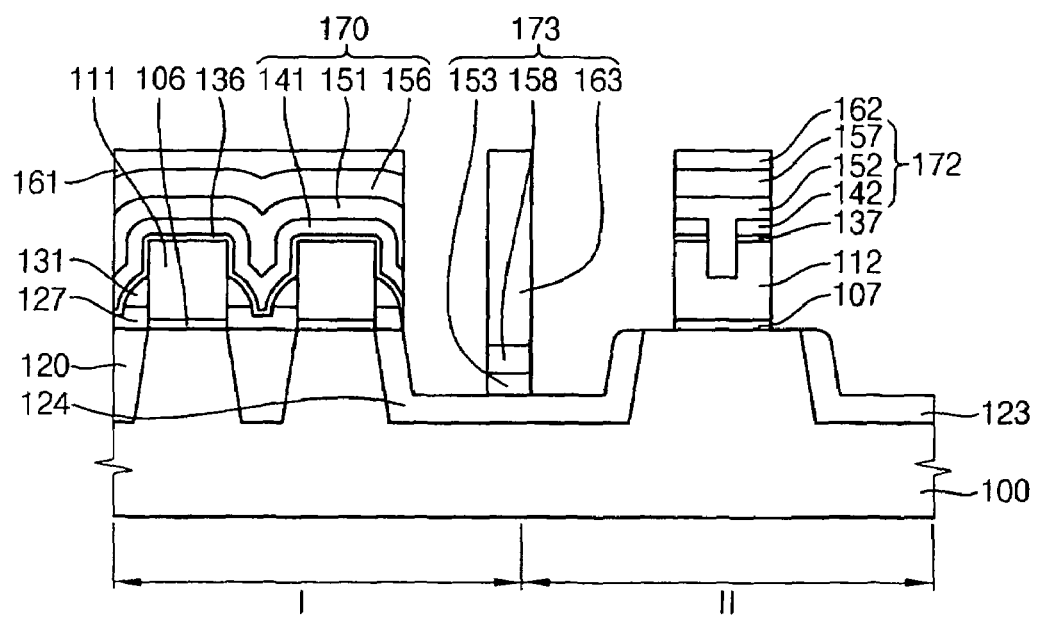

Referring to FIG. 15, the mask layer 160 may be etched using the first to the third photoresist patterns 165, 166 and 167 as etching masks, so that a first mask 161, a second mask 162, and a third mask 163 are provided on the fourth conductive layer 155. The first mask 161 may be on a first portion of the fourth conductive layer 155 in the first area I. The second mask 162 may be on a second portion of the fourth conductive layer 155 in the second area II. The third mask 163 is positioned on a third portion of the fourth conductive layer 155 between the first area I and the second area II. As a result, gate structures may be provided in the second area II while forming the cell transistors in the first area I. Each gate structure may include the first upper electrode 142, the second dielectric layer pattern 137, the lower electrode 112, and the gate insulation layer 107.

In example embodiments, the first mask 161 may have a width substantially larger than those of the second and the third masks 162 and 163. Further, the second mask 162 may also have a width substantially wider than that of the third mask 163.

Using the first to the third masks 161, 162 and 163 as etching masks, the fourth conductive layer 155 and the third conductive layer 150 may be etched to form a control gate structure 170, an upper electrode structure 172, and a preliminary buried shield structure 173. The control gate structure 170 may be formed on the first dielectric layer pattern 136 in the first area I. The upper electrode structure 172 may be on the lower electrode 112 and the second dielectric layer pattern 137 in the second area II. The preliminary buried shield structure 173 may be on the third isolation layer pattern 124, and between the first and the second areas I and II.

The control gate structure 170 may include the first control gate 141, a second control gate 151, and a third control gate 156. The second and the third control gate 151 and 156 may be formed by partially etching the third and the fourth conductive layers 150 and 155, respectively. As described above, the cell transistors may share the second control gate 151 and the third control gate 156.

The upper electrode structure 172 may include the first upper electrode 142, a second upper electrode 152, and a third upper electrode 157. The second and the third upper electrodes 152 and 157 may be formed by partially etching the third and the fourth conductive layers 150 and 155. Since the first upper electrode 142 contacts the lower electrode 112, the upper electrode structure 172 may be electrically connected to the lower electrode 112.

The preliminary buried shield structure 173 may include a first pattern 153, a second pattern 158, and the third mask 163. The first pattern 153 may be positioned on the third isolation layer pattern 124. The first pattern 153 and the second pattern 158 may be formed by etching the third conductive layer 150 and the fourth conductive layer 155, respectively. Thus, the preliminary buried shield structure 173 may be formed at the same time as the cell transistors and the high voltage gate structures, such that the preliminary buried shield structure 173 may be obtained without any additional processes.

In example embodiments, the sacrificial spacer 132 and the second upper insulation layer pattern may be are removed in the formation of the high voltage structures in the second area II. Further, widths of the lower electrode 112, the second dielectric layer pattern 137, and the first upper electrode 142 may be reduced when the lower electrode 112, the second dielectric layer pattern 137, and the first upper electrode 142 are etched while forming the gate structures in the second area II.

Figure 16:
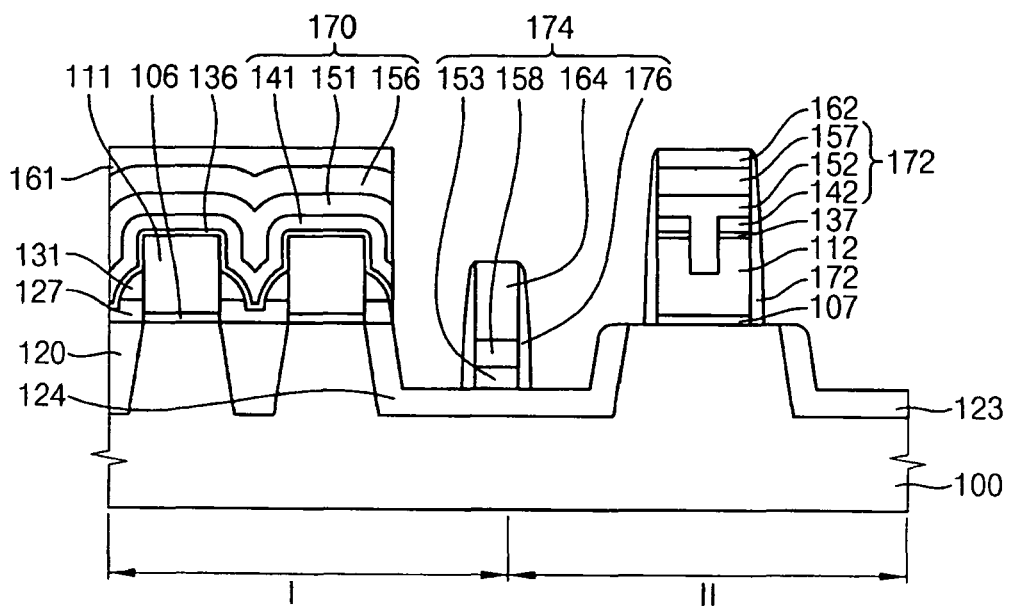

Referring to FIG. 16, the third mask 163 of the preliminary buried shield structure 173 may be partially removed to form a third pattern 164 on the second pattern 158. When the third mask 163 includes a carbon film and a nitride film, the carbon and the nitride films may be removed to form the third pattern 164 having a thickness considerably smaller than that of the third mask 163. Thus, a buried shield structure 174 may have a considerably reduced height compared to the preliminary buried shield structure 173.

A second spacer 171 may be formed on a sidewall of the high voltage gate structure in the second area II, and a sidewall spacer 176 may be formed on a sidewall of the preliminary buried shield structure 173. Thus, the buried shield structure 174 having a sidewall spacer may be provided between the first and the second areas I and II while forming the high voltage transistors in the second area II. The high voltage transistor may include the gate insulation layer 107, the lower electrode 117, the second dielectric layer pattern 137, the upper electrode structure 172, the second mask 162, and the second spacer 171.

In example embodiments, the buried shield structure 174 may include the first pattern 153, the second pattern 158, the third pattern 164, and the sidewall spacer 176. The second spacer 171 and the sidewall spacer 176 may be formed using a nitride or an oxynitride. For example, the second and the sidewall spacers 171 and 176 may include silicon nitride or silicon oxynitride. Alternatively, the second and the sidewall spacers 171 and 176 may be formed using an oxide, e.g., silicon oxide. For example, the second and the sidewall spacers 171 and 176 may include middle temperature oxide.

Figure 17:
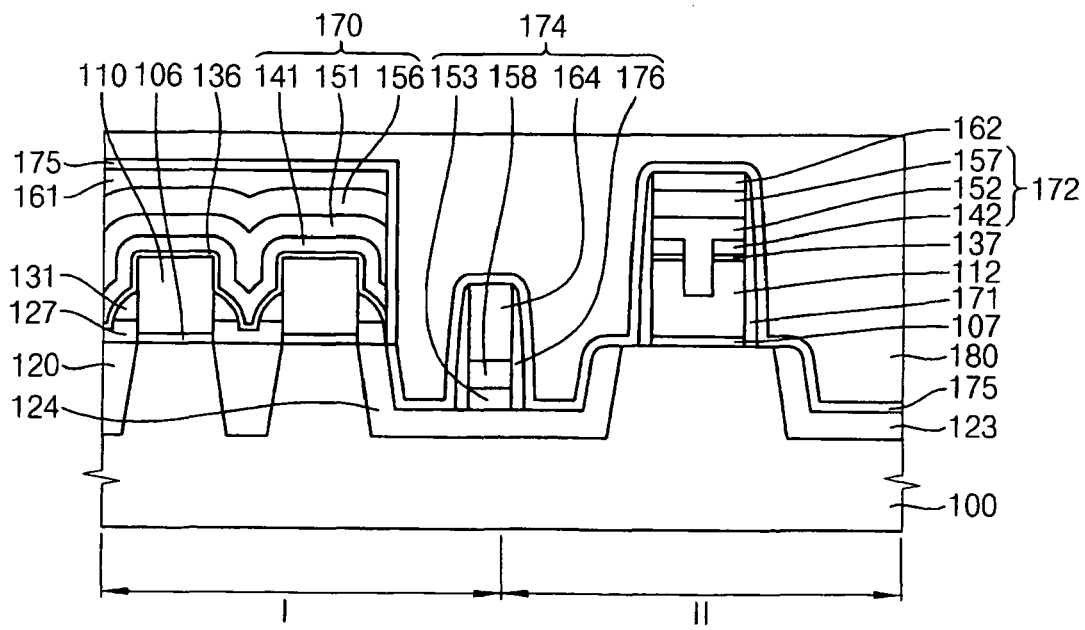

Referring to FIG. 17, an etch stop layer 175 may be formed on the substrate 100 to cover the cell transistors, the buried shield structure 174 and the high voltage transistor. The etch stop layer 175 may be conformally formed on the second and the third isolation layer patterns 123 and 124 along profiles of the cell transistors, the buried shield structure 174, and the high voltage transistor.

In example embodiments, the etch stop layer 175 may be formed using a nitride, e.g., silicon nitride. The etch stop layer 175 may have a thickness of about 200 Å to about 500 Å.

An insulation interlayer 180 may be formed on the etch stop layer 175 to completely cover the buried shield structure 174, the high voltage transistors, and the cell transistors. The insulation interlayer 180 may be formed using silicon oxide by a CVD process, an LPCVD process, a PECVD process, an HDP-CVD process, etc. For example, the insulation interlayer 180 may be formed using USG, SOG, TEOS, PE-TEOS, PSG, BPSG, FOX, TOSZ, HDP-CVD oxide, etc.

In example embodiments, the insulation interlayer 180 may have a multilayer structure. In the formation of the insulation interlayer 180, a first oxide film may be formed on the etch stop layer 175 and a second oxide film may be formed on the first oxide film. The first oxide film may have a thickness of about 1,000 Å to about 2,000 Å and the second oxide film may have a thickness off about 4,000 Å to about 6,000 Å.

Each of the first and the second oxide films may be formed by an HDP-CVD process. When the insulation interlayer 180 has the multilayer structure, the insulation interlayer 180 may effectively cover the cell transistors, the buried shield structure 174, and the high voltage transistors, without having voids or seams therein.

Figure 18:
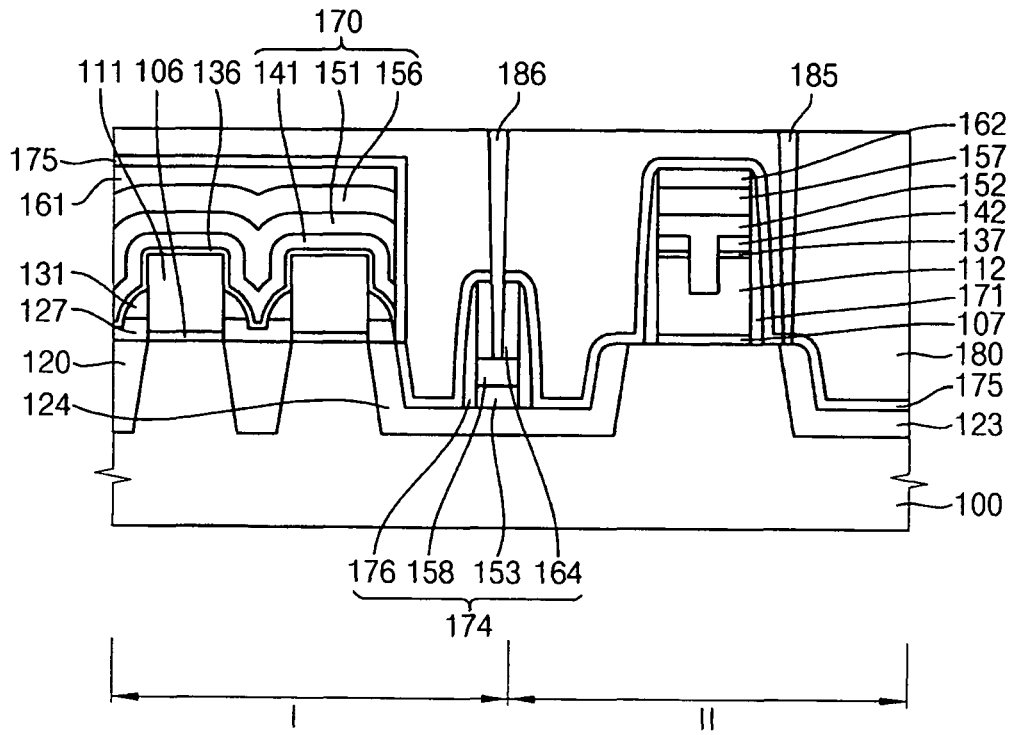

Referring to FIG. 18, the insulation interlayer 180 and the etch stop layer 175 may be partially etched to form a first contact hole (filled) in the second area II. Additionally, the insulation interlayer 180, the etch stop layer 175, and the third pattern 164 may be partially etched to form a second contact hole (filled) between the first and the second areas I and II. The first contact hole may expose a portion of the second area II adjacent to the high voltage transistor. For example, the first contact hole may expose source/drain regions of the high voltage transistor. The second contact hole may expose the second pattern 164 of the buried shield structure 174.

An upper conductive layer (not illustrated) may be formed on the insulation interlayer 180 to fill up the first and the second contact holes. The upper conductive layer may be formed using a metal and/or a metal compound. For example, the upper conductive layer may include aluminum, copper, titanium, tungsten, aluminum nitride, tungsten nitride, titanium nitride, etc. These may be used alone or in a mixture thereof. The upper conductive layer may be formed by a CVD process, a sputtering process, a PECVD process, a PLD process, an evaporation process, etc.

The upper conductive layer may be removed until the insulation interlayer 180 is exposed, so that a first contact 185 and a second contact 186 are formed in the first contact hole and the second contact hole, respectively. In some example embodiments, upper conductive lines may be provided on the insulation interlayer 180 while forming the first and the second contacts 185 and 186.

According to example embodiments, the buried shield structure 174 may be formed between the first area I and the second area II, so that an inversion of the semiconductor device may be prevented to improve electrical characteristics of the semiconductor device. That is, the breakdown of the flash memory device may be effectively prevented to enhance the electrical characteristics of the flash memory device because the buried shield structure 174 is positioned between the cell transistor and the high voltage transistor.

FIGS. 19 to 23 illustrate cross-sectional views of stages in a method of manufacturing a semiconductor device in accordance with example embodiments. In the method of the semiconductor device illustrated in FIGS. 19 to 23, processes up to formation of a mask layer 260 are substantially the same as, or substantially similar to, those described with reference to FIGS. 1 to 13, and details thereof will not be repeated.

Figure 19:
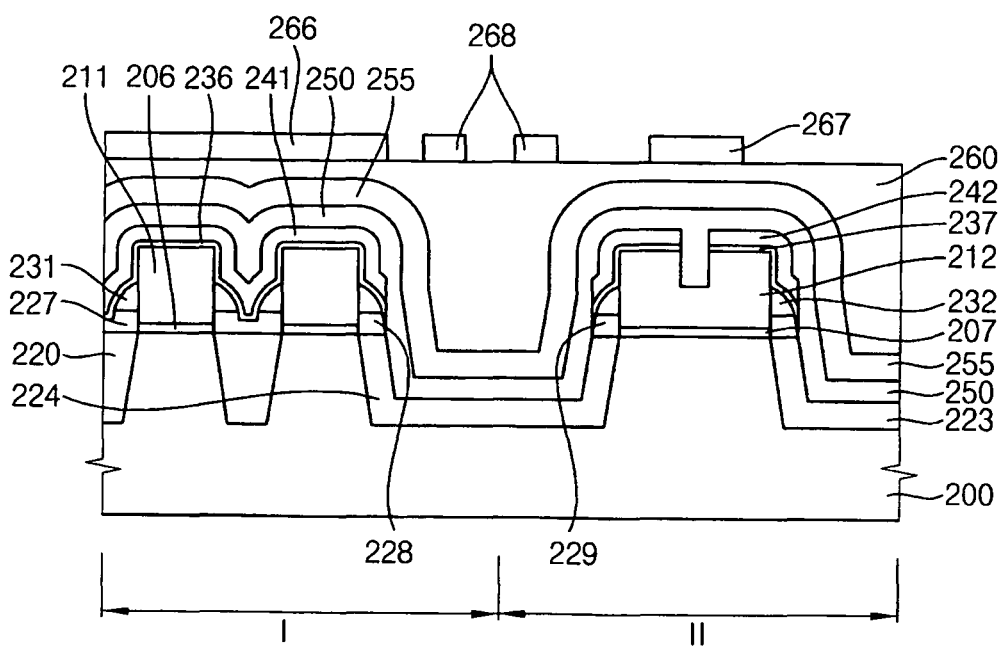
FIGS. 19 to 23 illustrate cross-sectional views of stages in a method of manufacturing a semiconductor device in accordance with example embodiments.

Referring to FIG. 19, a first photoresist pattern 266, a second photoresist pattern 267, and third photoresist patterns 268 may be provided on the mask layer 260. The first photoresist pattern 266 may cover the first area I of a substrate 200, and the second photoresist pattern 267 may partially cover the second area II of the substrate 200. The third photoresist patterns 268 may be positioned between the first and second areas I and II.

In example embodiments, the mask layer 260 may have a multilayer structure. For example, the mask layer 260 may include an oxide film formed on the fourth conductive layer 255, an organic material film formed on the oxide film, and a nitride film formed on the organic film. The oxide film may be formed using silicon oxide by a PECVD process or an HDP-CVD process. The oxide film may have a thickness of about 2,000 Å to about 3,000 Å. The organic material film may include carbon obtained by a CVD process. The organic material film may have a thickness of about 2,000 Å to about 3,000 Å. The nitride film may be formed using silicon nitride obtained by a CVD process or a PECVD process. The nitride film may have a thickness of about 300 Å to about 500 Å.

The first photoresist pattern 266 may have a width substantially larger than that of the second photoresist pattern 267 and those of each of the third photoresist patterns 268. Further, the second photoresist pattern 267 may also have a width substantially larger than those of the third photoresist patterns 268. Two third photoresist patterns 268 may be formed on the mask layer 260 when two buried shield structures 274 (see FIG. 21) are to be formed between the first and the second area I and II.

Figure 20:
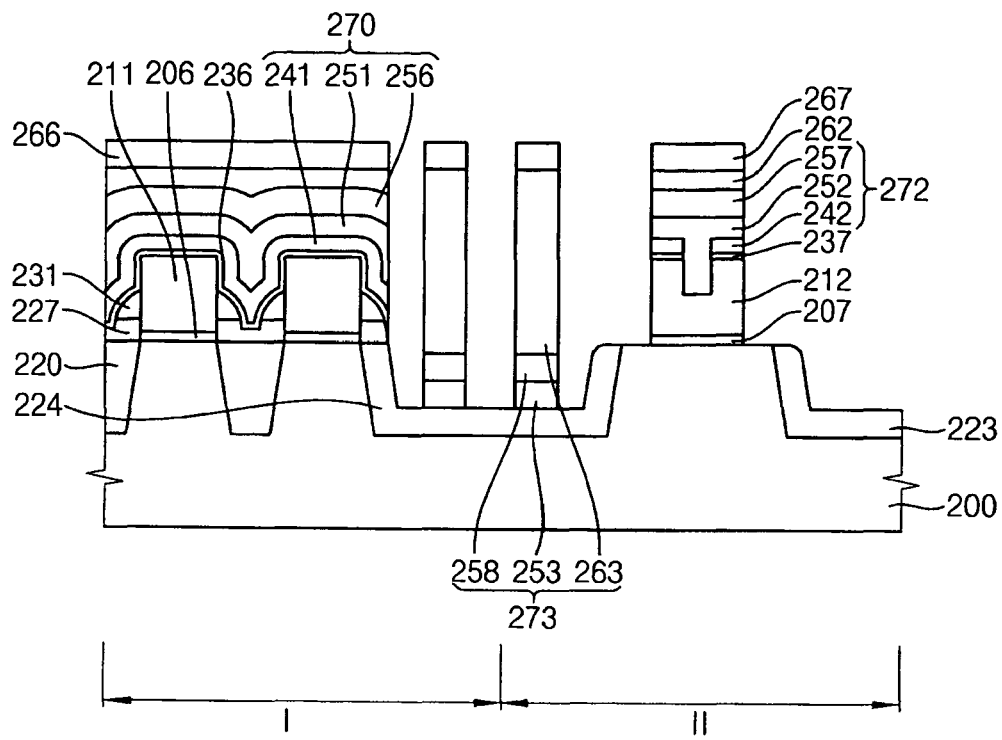

Referring to FIG. 20, the mask layer 260 may be partially etched using the first to the third photoresist patterns 266, 267 and 268, so that a first mask 261, a second mask 262, and two third masks 263 are formed on the fourth conductive layer 255. In an etching process for forming the first to the third masks 261, 262, and 263, an etching end point may be determined based on exposure of the substrate 200 or a second isolation layer pattern 223 and a third isolation layer pattern 224. That is, the etching process may be stopped when the second and the third isolation layer patterns 223 and 224 are exposed or when the substrate 200 is exposed.

The first mask 261 may cover cell gate structures in the first area I. Each cell gate structure may include a tunnel insulation layer 206, a floating gate 211, a first dielectric layer pattern 236, a first spacer 231, and a first control gate 241.

The second mask 262 may cover high voltage gate structures in the second area II. Each high voltage gate structure may include a gate insulation layer 207, a lower electrode 212, a second dielectric layer pattern 237, and a first upper electrode 242. Here, the first upper electrode 242 passes through the second dielectric layer pattern 237 to be connected with the lower electrode 212.

The third masks 263 may be positioned on a portion of the fourth conductive layer 255 between the first and the second areas I and II. One of the third masks 263 may be adjacent to an outermost cell gate structure in the first area I, whereas the other of the third masks 264 may be adjacent to an outermost high voltage gate structure in the second area II.

The fourth conductive layer 255 and a third conductive layer 250 may be etched using the first to the third masks 261, 262, and 263 as etching masks. Further, a sacrificial spacer 232 and a second upper insulation layer pattern 229 may be removed from the second area II while partially etching the fourth conductive layer 255 and the third conductive layer 250. As a result, cell transistors and high voltage transistors may be formed in the first and the second areas I and II while forming two preliminary buried shield structures 273 on the third isolation layer pattern 224, the two preliminary buried shield structures being between the first and the second areas I and II.

Each of the cell transistors may include the tunnel insulation layer 206, the floating gate 211, the first dielectric layer pattern 236, the first spacer 231, and a control gate structure 270. The control gate structure 270 may include the first control gate 241, a second control gate 251, and a third control gate 256. The second and the third control gates 251 and 256 maybe formed by etching the third and the fourth conductive layers 250 and 255. A first upper insulation layer pattern 227 may be provided between adjacent cell transistors in the first area I. Each of the high voltage transistors may include the gate insulation layer 207, the lower electrode 212, the second dielectric layer pattern 237, and an upper electrode structure 272. The upper electrode structure 272 may include the first upper electrode 242, a second upper electrode 252 and a third upper electrode 257. The second and the third upper electrodes 252 and 257 may also be formed by partially etching the third and the fourth conductive layers 250 and 255. Each of the preliminary buried shield structures 273 may include a first pattern 253, a second pattern 258, and the third mask 263. The first and the second patterns 253 and 258 may be formed by partially etching the third and the fourth conductive layers 250 and 255.

Figure 21:
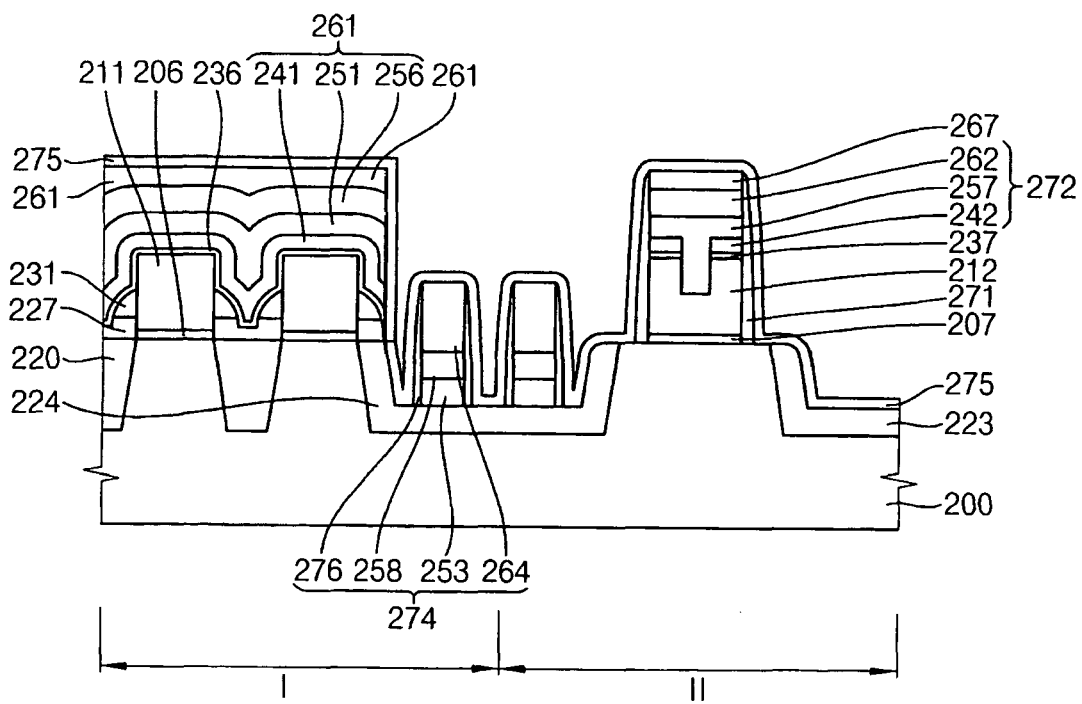

Referring to FIG. 21, the first to the third photoresist patterns 266, 267 and 268 may be removed from the first to the third masks 261, 262 and 263, respectively. The first to the third photoresist patterns 266, 267 and 268 may be removed by an ashing process and/or a stripping process. Then, each of the third masks 263 may be partially removed to form a third pattern 264 on the second pattern 258. Thus, two buried shield structures 274 may be provided between the first and the second areas I and II.

In example embodiments, the nitride film and the organic material film of the mask layer 260 may be etched when the third masks 263 are partially removed, so that the third patterns 264 may have a height substantially smaller than those of the third masks 263, respectively.

A second spacer 271 may be formed on a sidewall of the high voltage transistor, and third spacers 276 are formed on sidewalls of the buried shield structures 274. The second and the third spacers 271 and 276 may be formed using a material having an etching selectivity relative to a conductive material such as metal or metal compound. For example, the second and the third spacers 271 and 276 may include a nitride, e.g., silicon nitride or an oxynitride, e.g., silicon oxynitride. Alternatively, the second and the third spacers 271 and 276 may be formed using an oxide, e.g., middle temperature oxide.

An etch stop layer 275 may be formed over the substrate 200 to cover the cell transistors, the buried shield structures 274, and the high voltage transistors. The etch stop layer 275 may be conformally formed along profiles of the cell transistors, the buried shield structures 274 and the high voltage transistors. The etch stop layer 275 may be formed using a material that has an etching selectivity with respect to oxide. For example, the etch stop layer 275 may include silicon nitride or silicon oxynitride.

Figure 22:
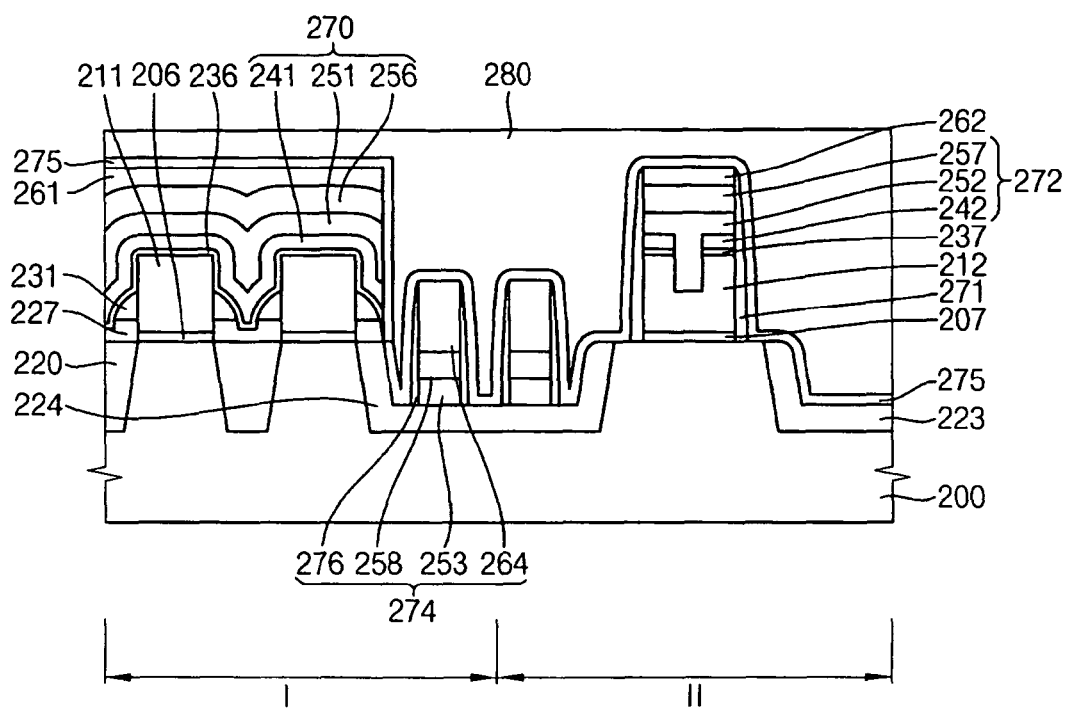

Referring to FIG. 22, an insulation interlayer 280 may be formed on the etch stop layer 275 to sufficiently cover the cell transistors, the buried shield structures 274, and the high voltage transistors. The insulation interlayer 280 may be formed using an oxide, e.g., silicon oxide, by a CVD process, a PECVD process, an HDP-CVD process, etc.

In example embodiments, the insulation interlayer 280 may have a multilayer structure that includes more than two oxide films. For example, the insulation interlayer 280 may be obtained by forming a second oxide film on a first oxide film after forming the first oxide film on the etch stop layer 275. Here, the first and the second oxide films may be formed by PECVD processes and HDP-CVD processes, respectively. The first oxide film may have a thickness of about 2,000 Å and the second oxide film may have a thickness of about 6.000 Å. The insulation interlayer 280 may be planarized to ensure a flat upper face thereof, e.g., through a CMP process and/or an etch-back process.

Figure 23:
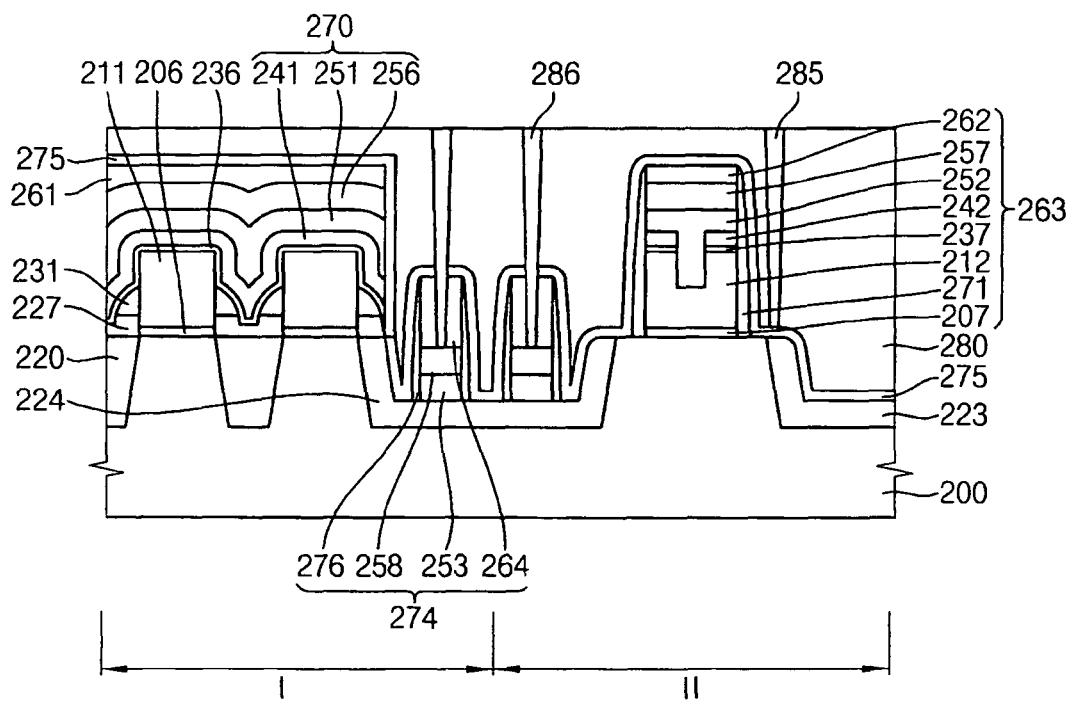

Referring to FIG. 23, after the insulation interlayer 280 is partially etched to form a first contact hole and second contact holes, an upper conductive layer (not illustrated) may be formed on the insulation interlayer 280 to fill up the first and the second contact holes. The upper conductive layer may be formed using a metal and/or a metal compound. The first contact hole may expose a portion of the second area II adjacent to the high voltage transistor. For example, the first contact hole may expose source/drain regions of the high voltage transistor. Each second contact hole may expose a corresponding second pattern 258 of the buried shield structures 274.

When the upper conductive layer is removed until the insulation interlayer 280 is exposed, a first contact 285 and second contacts 286 may be formed in the first contact hole and the second contact holes, respectively. Here, upper conductive lines may be provided on the insulation interlayer 280 while forming the first and the second contacts 285 and 286.

According to example embodiments, a plurality of buried shield structures 274 may be provided between the first area I and the second area II, so that an inversion of the flash memory device may be effectively prevented to thereby improve electrical characteristics of the flash memory device. Namely, a breakdown of the flash memory device may be considerably prevented to improve the electrical characteristics of the flash memory device because two buried shield structures 274 are provided between the cell transistors and the high voltage transistors. When two or more buried shield structures are formed between adjacent high voltage transistors, the semiconductor device including the buried shield structures and the high voltage transistors may ensure high electrical performance without an electrical failure such as a breakdown, a leakage current, etc.

FIGS. 24 to 28 illustrate cross-sectional views of stages in a method of manufacturing a semiconductor device in accordance with example embodiments. In the method of the semiconductor device illustrated in FIGS. 24 to 28, processes up to a mask layer 360 are substantially the same as or substantially similar to those described with reference to FIGS. 1 to 13, and details thereof will not be repeated.

Figure 24:
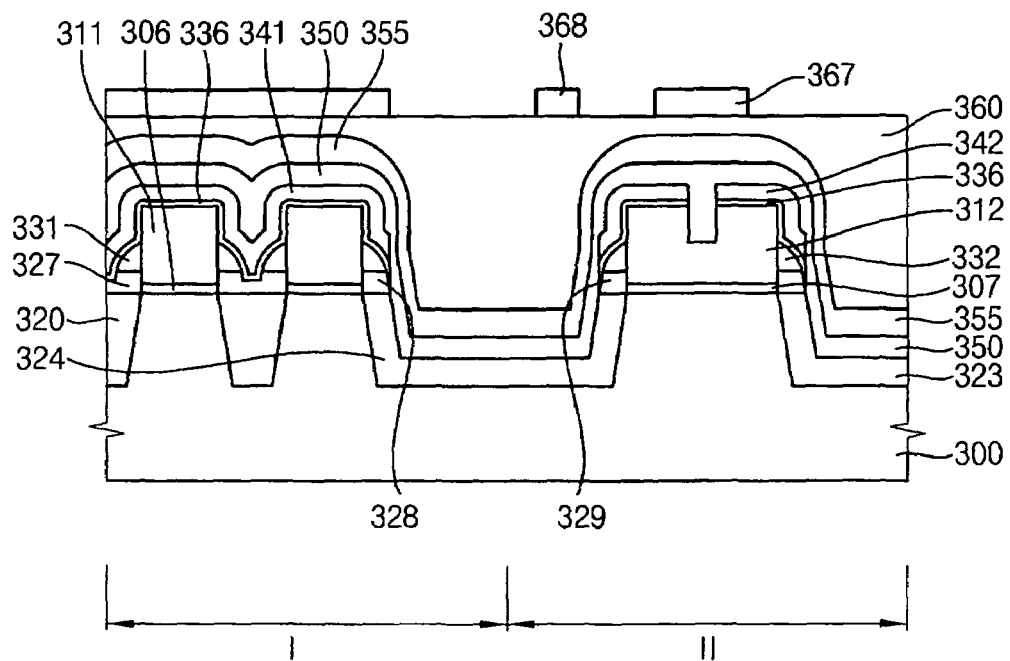
FIGS. 24 to 28 illustrate cross-sectional views of stages in a method of manufacturing a semiconductor device in accordance with example embodiments.

Referring to FIG. 24, a first photoresist pattern 366, a second photoresist pattern 367, and a third photoresist pattern 368 may be provided on the mask layer 360. The first photoresist pattern 366 may cover a first area I of a substrate 300. The second photoresist pattern 367 may partially cover a second area II of the substrate 300. The third photoresist pattern 368 may be on a portion of the mask layer 360 between the first and the second areas I and II. The third photoresist pattern 368 may be closer to an outermost high voltage gate structure than to an outermost cell gate structure.

In example embodiments, the mask layer 360 may have a multilayer structure. For example, the mask layer 360 may include an oxide film formed on a fourth conductive layer 355, an organic material film formed on the oxide film, and a nitride film formed on the organic film. The oxide film may be formed using silicon oxide by a PECVD process or an HDP-CVD process. The oxide film may have a thickness of about 2,000 Å to about 3,000 Å. The organic material film may include carbon obtained by a CVD process. The organic material film may have a thickness of about 2,000 Å to about 3,000 Å. The nitride film may be formed using silicon nitride obtained by a CVD process or a PECVD process. The nitride film may have a thickness of about 300 Å to about 500 Å. A planarization process may be performed on the mask layer 360 to ensure a level upper face of the mask layer 360.

The first photoresist pattern 366 may have a width substantially larger than that of the second photoresist pattern 367 and that of the third photoresist pattern 368. Additionally, the second photoresist pattern 367 may also have a width substantially larger than that of the third photoresist pattern 368. Since the third photoresist pattern 368 may be closer to the second area II than the first area I, a buried shield structure 374 (see FIG. 26) is adjacent, i.e., closer, to an outermost high voltage transistor in the second area II.

Figure 25:
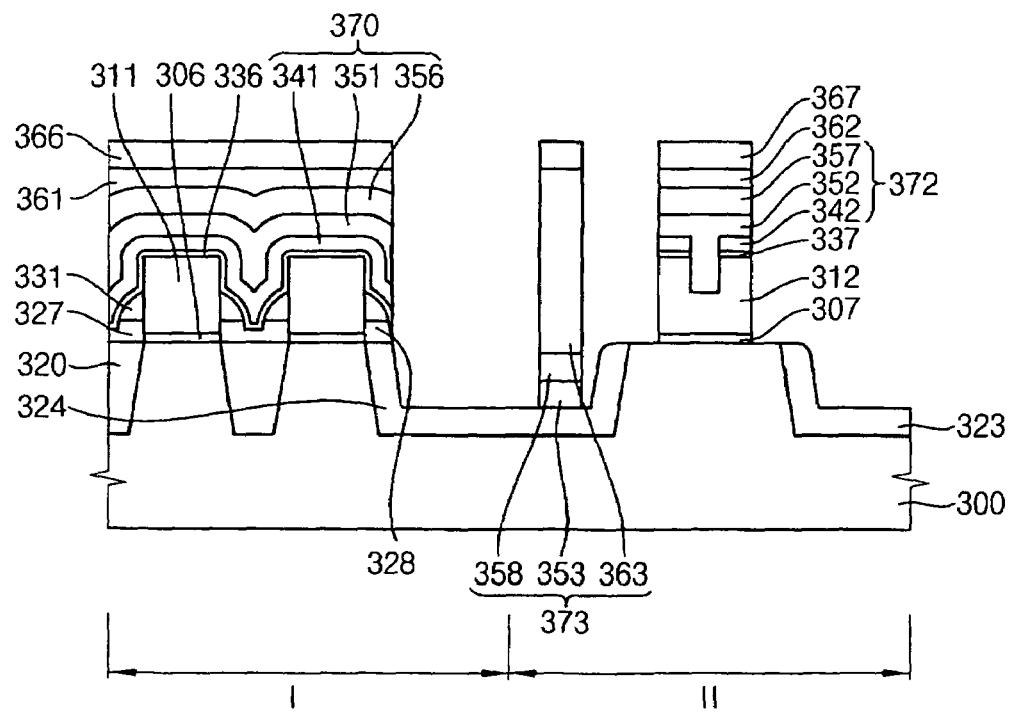

Referring to FIG. 25, the mask layer 360 is etched using the first to the third photoresist patterns 366, 367, and 368 as etching masks. Thus, a first mask 361, a second mask 362, and a third mask 363 are formed on the fourth conductive layer 355. In an etching process for forming the first to the third masks 361, 362 and 363, an etching end point may be determined based on exposure of the substrate 300 or a second isolation layer pattern 323 and a third isolation layer pattern 324.

The first mask 361 may cover cell gate-structures in the first area I. Each cell structure may include a tunnel insulation layer 306, a floating gate 311, a first dielectric layer pattern 336, a first spacer 331, and a first control gate 341.

The second mask 362 may cover high voltage gate structures in the second area II. Each high voltage gate structures may include a gate insulation layer 307, a lower electrode 312, a second dielectric layer pattern 337, and a first upper electrode 342. The first upper electrode 342 may pass through the second dielectric layer pattern 337 to be connected with the lower electrode 312.

The third mask 363 may be positioned on a portion of the fourth conductive layer 355 adjacent to an outermost high voltage gate structure. Hence, the third mask 263 may be further from an outermost cell gate structure in comparison with an outermost high voltage gate structure.

The fourth conductive layer 355 and a third conductive layer 350 may be partially etched using the first to the third masks 361, 362, and 363 as etching masks. Additionally, a sacrificial spacer 332 and a second upper insulation layer pattern 329 are removed from the second area II while partially etching the fourth and the third conductive layers 355 and 350. Therefore, a preliminary buried shield structure 373 on the third isolation layer pattern 324 between the first and the second areas I and II may be formed while forming cell transistors and high voltage transistors in the first and the second areas I and II.

Each of the cell transistors may include the tunnel insulation layer 306, the floating gate 311, the first dielectric layer pattern 336, the first spacer 331, and a control gate structure 370. The control gate structure 370 may include the first control gate 341, a second control gate 351 and a third control gate 356 in which the second and the third control gates 351 and 356 are formed by etching the third and the fourth conductive layers 350 and 355. A first upper insulation layer pattern 327 may be between adjacent cell transistors in the first area I.

Each of the high voltage transistors may include the gate insulation layer 307, the lower electrode 312, the second dielectric layer pattern 337, and an upper electrode structure 372. The upper electrode structure 372 may include the first upper electrode 342, a second upper electrode 352, and a third upper electrode 357, wherein the second and the third upper electrodes 352 and 357 may also be formed by partially etching the third and the fourth conductive layers 350 and 355. The preliminary buried shield structure 373 may include a first pattern 353, a second pattern 358 and the third mask 363. The first and the second patterns 353 and 358 may also be obtained by partially etching the third and the fourth conductive layers 350 and 355.

Figure 26:
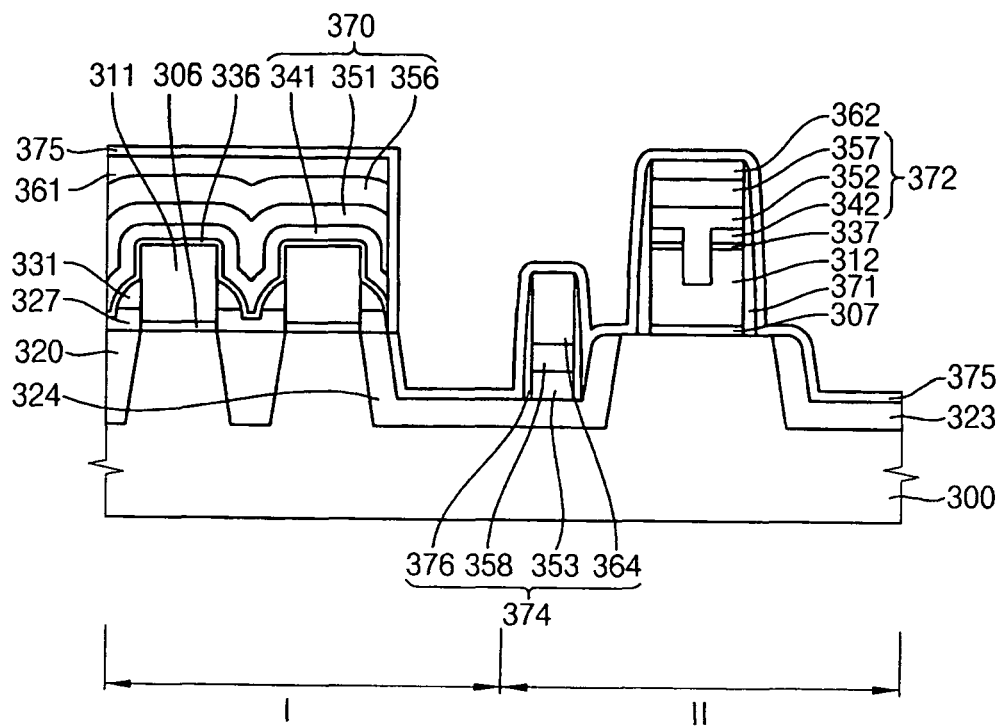

Referring to FIG. 26, after removing the first to the third photoresist patterns 366, 367, and 368 from the first to the third masks 361, 362, and 363, e.g., by an ashing process and/or a stripping process, the third mask 363 may be partially removed to form a third pattern 364 on the second pattern 358. Hence, the buried shield structures 374 are formed between the first and the second areas I and II. Here, the buried shield structures 374 may be adjacent to the outermost high voltage transistor in comparison with the outermost cell transistor as described above. In example embodiments, the nitride film and the organic material film of the mask layer 360 may be etched when the third mask 363 is partially removed. Thus, the third pattern 364 may have a height substantially smaller than that of the third mask 363.

A second spacer 371 may be formed on a sidewall of the high voltage transistor. Third spacers 376 may be formed on a sidewall of the buried shield structure 374. The second and the third spacers 371 and 376 may be formed using a material having an etching selectivity relative to a conductive material such as metal or metal compound. For example, the second and the third spacers 371 and 376 may include oxide such as middle temperature oxide.

An etch stop layer 375 may formed over the substrate 300 to cover the cell transistors, the buried shield structure 374, and the high voltage transistors. The etch stop layer 375 may be conformally formed along profiles of the cell transistors, the buried shield structure 374 and the high voltage transistors. The etch stop layer 375 may be formed using a material that has an etching selectivity with respect to oxide. For example, the etch stop layer 375 may include silicon nitride or silicon oxynitride.

Figure 27:
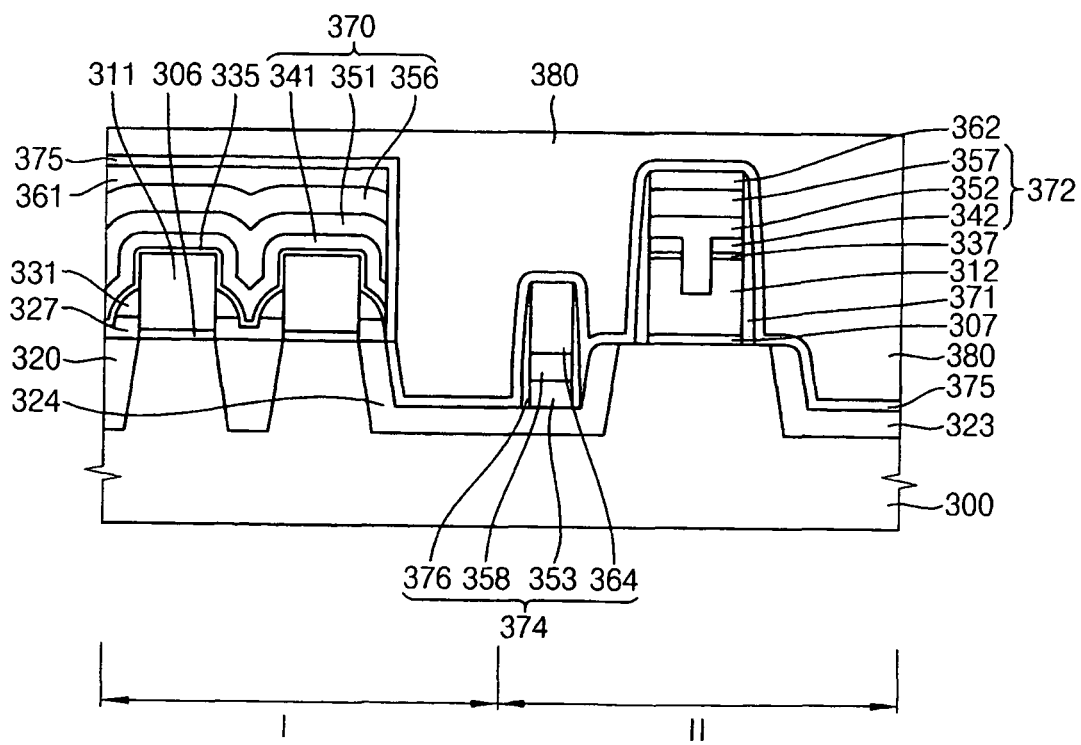

Referring to FIG. 27, an insulation interlayer 380 is formed on the etch stop layer 375 to sufficiently cover the cell transistors, the buried shield structure 374 and the high voltage transistors. The insulation interlayer 380 may be formed using an oxide, e.g., silicon oxide, by a CVD process, a PECVD process, an HDP-CVD process, etc. In example embodiments, the insulation interlayer 380 may have a multilayer structure that includes more than two oxide films. For example, the insulation interlayer 380 may be obtained by forming a second oxide film on a first oxide film after forming the first oxide film on the etch stop layer 375. Here, the first and the second oxide films may be formed by PECVD processes or HDP-CVD processes, respectively. The first oxide film may have a thickness of about 2,000 Å and the second oxide film may have a thickness of about 6,000 Å. The insulation interlayer 380 may be planarized to ensure a flat upper face thereof through a CMP process and/or an etch-back process.

Figure 28:
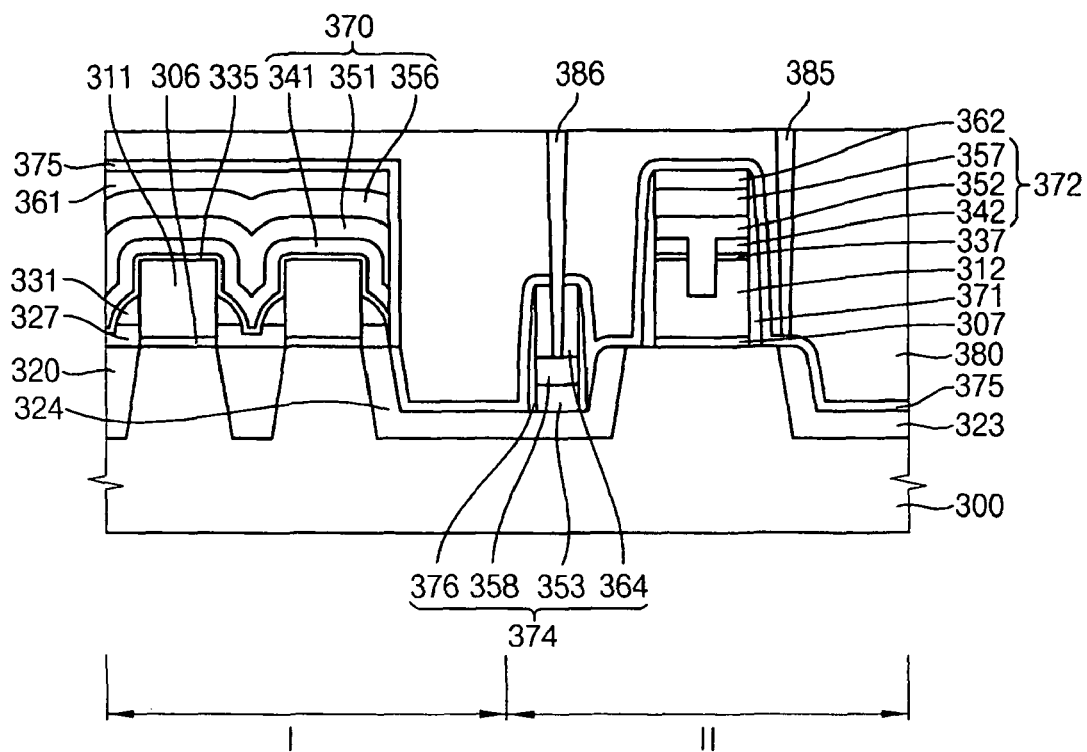

Referring to FIG. 28, the insulation interlayer 380 may be partially etched to form a first contact hole and a second contact hole, and then an upper conductive layer (not illustrated) may be formed on the insulation interlayer 380 to fill up the first and the second contact holes. The upper conductive layer may be formed using a metal and/or a metal compound. The first contact hole may expose a portion of the second area II adjacent to the high voltage transistor. For example, the first contact hole may expose source/drain regions of the high voltage transistor. The second contact hole may expose the second pattern 358 of the buried shield structure 374.

When the upper conductive layer is removed until the insulation interlayer 380 is exposed, a first contact 385 and a second contact 386 may be formed in the first contact hole and the second contact hole, respectively. Here, upper conductive lines may be provided on the insulation interlayer 380 while forming the first and the second contacts 385 and 386.

According to example embodiments, the buried shield structure 374 may be provided closer to the high voltage transistor rather than to the cell transistor, such that an inversion of the flash memory device may be more effectively prevented, thereby improving electrical characteristics of the flash memory device. A breakdown of the flash memory device may be effectively prevented to enhance electrical characteristics of the flash memory device because the buried shield structure 374 is provided closer to the high voltage transistor in comparison with the cell transistor. When the buried shield structure 374 is positioned adjacent to the high voltage transistor, the flash memory device including the buried shield structure 374 and the high voltage transistor may have a high electrical performance by preventing an electrical failure such as a breakdown, a leakage current, etc.

FIGS. 29 to 44 illustrate cross-sectional views of stages in a method of manufacturing a semiconductor device in accordance with example embodiments. First transistors, e.g., cell transistors, may be formed in a first area I of a substrate 400, and second transistors, e.g., high voltage transistors, may be formed in a second area II of the substrate 400. Although FIGS. 29 to 44 illustrate a method of manufacturing a flash memory device, the features and advantages of the invention may be employed in other nonvolatile semiconductor devices or volatile semiconductor devices.

Figure 29:
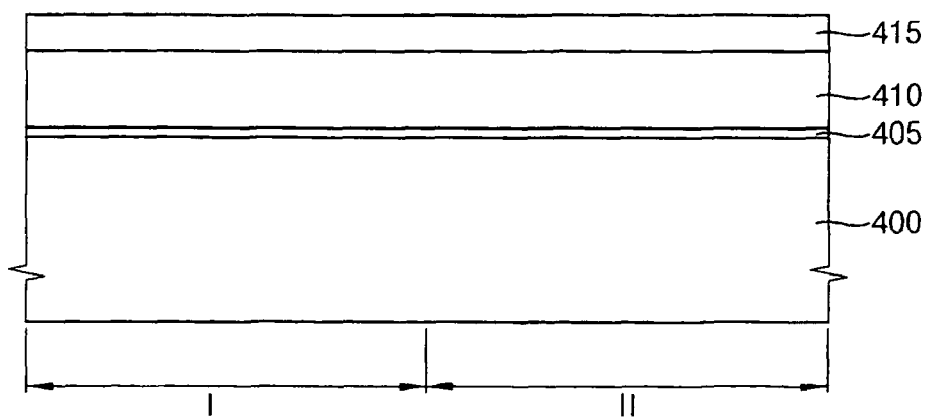
FIGS. 29 to 44 illustrate cross-sectional view of stages in a method of manufacturing a semiconductor device in accordance with example embodiments.

Referring to FIG. 29, a first insulation layer 405 may be formed on the substrate 400 having the first and the second areas I and II. The substrate 400 may include a semiconductor substrate, e.g., a single crystalline silicon substrate, a single crystalline germanium substrate, a silicon-germanium substrate, etc. The substrate 400 may include an SOI substrate, a GOI substrate, etc. The first insulation layer 405 may include an oxide and/or a metal oxide by a radical oxidation process, a CVD process, an ALD process, a sputtering process, a PLD process, etc. When the first insulation layer 405 is obtained by the radical oxidation process, the first insulation layer 405 may sufficiently ensure a desired structure and electrical characteristics for the tunnel insulation layer in the flash memory device.

In example embodiments, impurities may be doped into the first and the second areas I and II of the substrate 400 to form desired wells at predetermined portions of the substrate 400 considering electrical characteristics of the cell transistors and the high voltage transistors to be formed thereon. For example, P type and N type impurities may be implanted into the first and the areas I and II of the substrate 400 to form a P type well and an N type well in the first area I and the second area II, respectively.

A first conductive layer 410 may be formed on the first insulation layer 405. The first conductive layer 410 may be formed using polysilicon, a metal and/or a metal compound by a CVD process, an ALD process, a PECVD process, a sputtering process, a PLD process, an evaporation process, etc. In one example embodiment, the first conductive layer 410 may be formed by a PECVD process using polysilicon doped with impurities when the flash memory device is formed on the substrate 400.

In example embodiments, the first conductive layer 410 may have a multilayer structure having a thickness of about 500 Å to about 1,500 Å measured from an upper face of the first insulation layer 405. In the formation of the first conductive layer 410, a first conductive film may be formed on the first insulation layer 405, and then a second conductive film may be formed on the first conductive film. The first conductive film may have a thickness of about 200 Å to about 500 Å and the second conductive film may have a thickness of about 300 Å to about 1,000 Å.

A hard mask layer 415 may be provided on the first conductive layer 410. The hard mask layer 415 may be formed using a material that has an etching selectivity relative to the first conductive layer 410, the first insulation layer 405 and the substrate 400. For example, the hard mask layer 415 may include silicon nitride, silicon oxynitride, titanium oxynitride, etc. Alternatively, the hard mask layer 415 may have a multilayer structure that includes an oxide film, a nitride film, an organic material film and/or an oxynitride film. For example, the hard mask layer 415 may include an oxide film, a lower nitride film, an organic material film and an upper nitride film.

Figure 30:
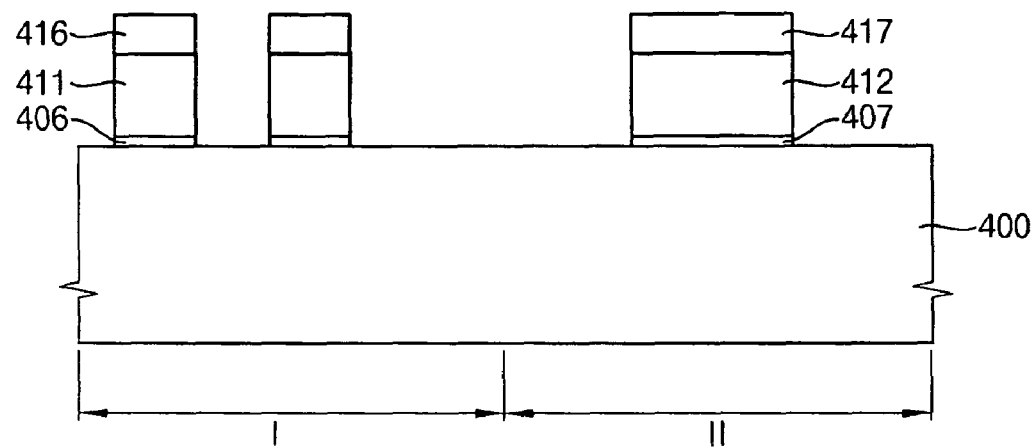

Referring to FIG. 30, a first hard mask 416 and a second hard mask 417 may be formed on the first conductive layer 410 by partially etching the hard mask layer 415. The first hard mask 416 may be positioned in the first area I of the substrate 400, whereas the second hard mask 417 may be located in the second area II of the substrate 400. The second hard mask 417 may have a width substantially larger than an individual first hard mask 416 when the high voltage transistor is formed in the second area II of the substrate 400.

The first conductive layer 410 and the first insulation layer 405 may be partially etched using the first and the second hard masks 416 and 417 as etching masks, so that a floating gate 411, a lower electrode 412, a tunnel insulation layer pattern 406, and a gate insulation layer pattern 407 are formed on the substrate 400. The tunnel insulation layer pattern 406 and the floating gate 411 may be formed in the first area I, and the gate insulation layer pattern 407 and the lower electrode 412 may be formed in the second area II. Thus, a first conductive structure and a second conductive structure may be provided in the first area I and the second area II, respectively. The first conductive structure may include the tunnel insulation layer pattern 406, the floating gate 411, and the first hard mask 416. The second conductive structure may include the gate insulation layer pattern 407, the lower electrode 412 and the second hard mask 417. In example embodiments, the tunnel insulation layer pattern 406 and the floating gate 411 may have widths substantially smaller than those of the gate insulation layer pattern 407 and the lower electrode 412, respectively. Further, the floating gate 411 and the lower electrode 412 may be simultaneously formed by performing one etching process, although the floating gate 411 may have dimensions substantially different from those of the lower electrode 412. Adjacent first conductive structures in the first area I may be disposed at an interval substantially smaller that an interval between adjacent second conductive structures in the second area II.

Figure 31:
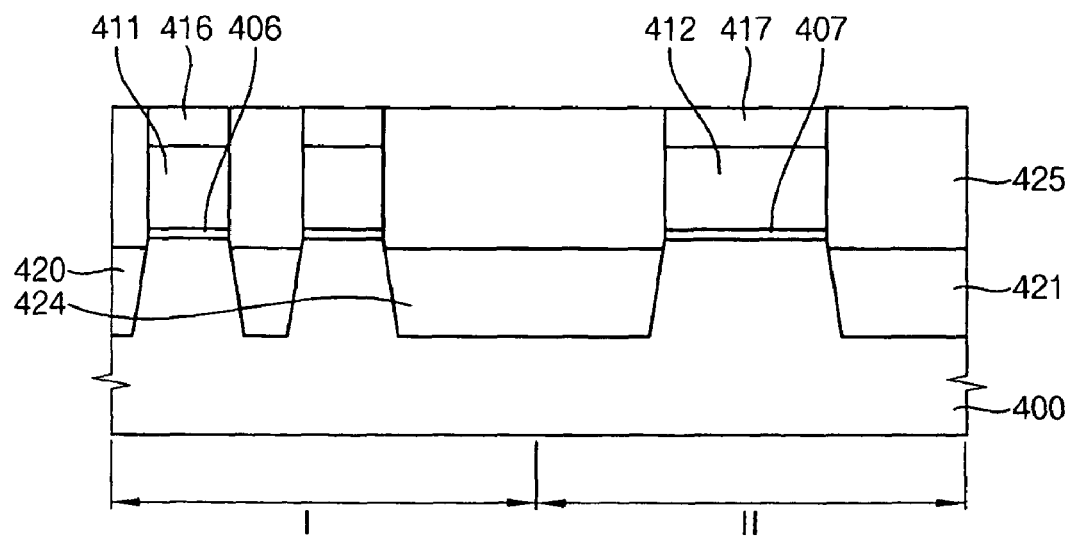

Referring to FIG. 31, the substrate 400 may be partially etched using the first and the second conductive structures as etching masks, such that a first trench (filled), a second trench (filled), and a third trench (filled) may be formed on the substrate 400. The first trench may be formed between adjacent first conductive structures. The second trench may be formed between adjacent the second conductive structures. Further, the third trench may be formed between the first area I and the second area II. Namely, the third trench may be formed between an outermost first conductive structure and an outermost second conductive structure. The second trench may have a width substantially larger than that of the first trench, and the third trench may have a width substantially the same as or substantially similar to that of the second trench. However, the first trench may have a depth substantially the same as, or substantially similar to, those of the second and the third trenches. Each of the first to the third trenches may have a depth of about 2,000 Å to about 4,000 Å measured from the upper face of the substrate 400.

A first isolation layer 420, a second isolation layer 421, and a third isolation layer 422 may be formed on the substrate 400 to fill up the first trench, the second trench and the third trench, respectively. Each of the first to the third isolation layers 420, 421 and 422 may be formed by an STI process, a thermal oxidation process, a CVD process, an HDP-CVD process, etc. The first to the third isolation layers 420, 421 and 422 may be formed using oxide. The first isolation layer 420 may electrically insulate adjacent cell transistors in the first area I. The second isolation layer 421 may electrically insulate adjacent high voltage transistors in the second area II. The third isolation layer 422 may electrically insulate the cell transistor from the high voltage transistor between the first and the second areas I and II.

In example embodiments, field impurities may be doped into portions of the substrate 400 where the first to the third trenches are formed before forming the first to the third trenches on the substrate 400. Hence, electrical insulation characteristics of the first to the third isolation layers 420, 421 and 422 may be enhanced due to the field impurities.

After a second insulation layer 425 is formed on the substrate 400 to cover the first and the second conductive structures, the second insulation layer 425 may be partially etched until the first and the second hard masks 416 and 417 are exposed. The second insulation layer 425 may be partially removed by a CMP process and/or an etch-back process. The second insulation layer 425 may be formed using silicon oxide by a CVD process, an LPCVD process, a spin coating process, a PECVD process, an HDP-CVD process, etc.

Figure 32:
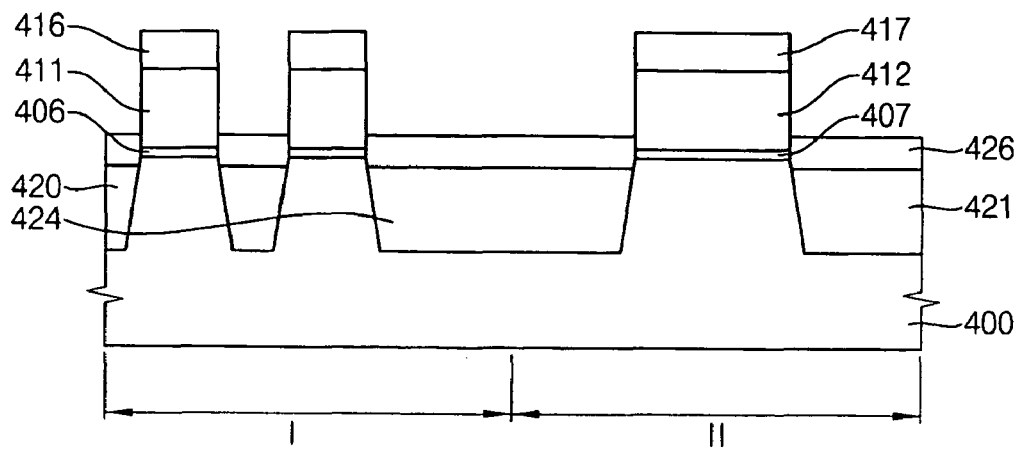

Referring to FIG. 32, the second insulation layer 425 may be etched to form an upper insulation layer 426 on the substrate 400. The upper insulation layer 426 may cover lower sidewalls of the floating gate 411 and the lower electrode 412, and may cover the third isolation layer 422 between the first and the second areas I and II. After the formation of the upper insulation layer 426, sidewalls of the first and the second conductive structures may be exposed.

Figure 33:
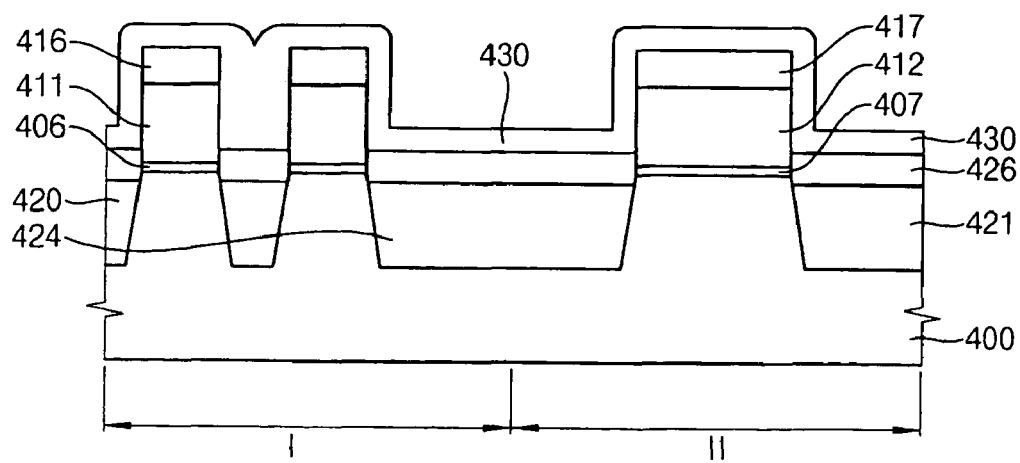

Referring to FIG. 33, a spacer formation layer 430 may be formed on the upper insulation layer 426 to cover the first and the second conductive structures. The spacer formation layer 430 may be formed using middle temperature oxide or silicon oxynitride by a CVD process, an LPCVD process, a PECVD process, an HDP-CVD process, etc. A gap between adjacent first conductive structures may be filled with the spacer formation layer 430 when the spacer formation layer 430 has a sufficient thickness, e.g., substantially larger than a half of a width of the gap between adjacent first conductive structures. When the spacer formation layer 430 fills up the gap between adjacent first conductive structures, a recess 434 (see FIG. 34) may be formed between the first area I and the second area II while etching the spacer formation layer 430.

Figure 34:
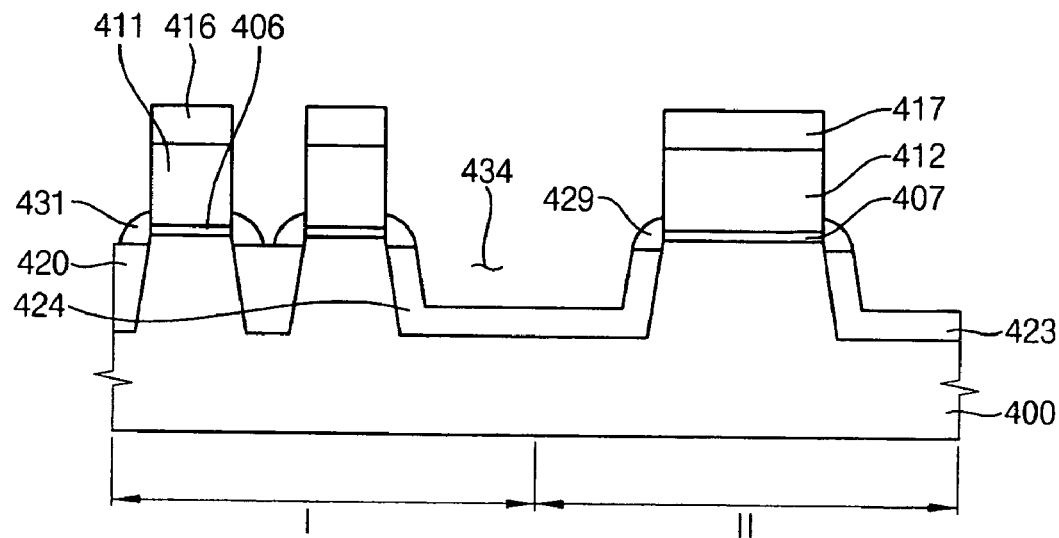

Referring to FIG. 34, the spacer formation layer 430 may be anisotropically etched to form a first spacer 431 and a sacrificial spacer 429. The first and the sacrificial spacers 431 and 429 may be positioned to enclose the lower sidewalls of the first and the second conductive structures, respectively. In etching the spacer formation layer 430, the second isolation layer 421 and the third isolation layer 422 may be partially etched, such that a second isolation layer pattern 423 and a third isolation layer pattern 424 may be formed in the second trench and the third trench, respectively. The upper insulation layer 426 may be removed while forming the first and the sacrificial spacers 431 and 429. The second and the third isolation layer patterns 423 and 424 may be positioned on lower faces and sidewalls of the second and the third trenches, respectively.

In example embodiments, the first and the sacrificial spacers 431 and 429 may increase a coupling ratio of the flash memory device. The coupling ratio of the flash memory device may mainly depend on the amount of charge between the floating gate 411 and a control gate structure 470 (see FIG. 41) of the flash memory device. Hence, the coupling ratio of the flash memory device may increase in accordance with the increase of the area between the floating gate 411 and the control gate structure 470. When the first and the sacrificial spacers 431 and 429 are positioned on the lower sidewalls of the first and the second conductive structures, the flash memory device may have an increased coupling ratio in comparison with that of the conventional flash memory device.

Figure 35:
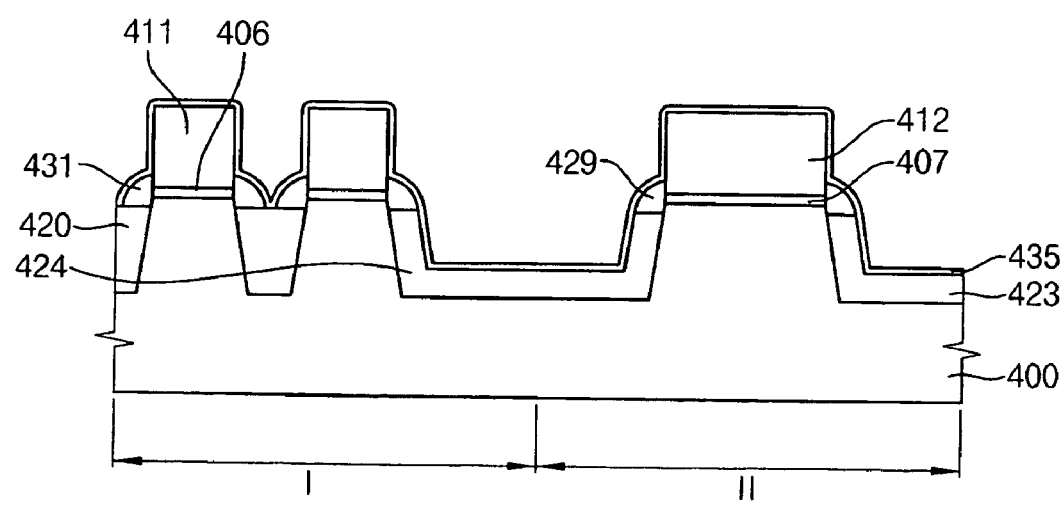

Referring to FIG. 35, a dielectric layer 435 may be formed on the resultant structures to cover the floating gate 411 and the lower electrode 412 after removing the first and the second masks 416 and 417 from the floating gate 411 and the lower electrode 412. The dielectric layer 435 may further cover the first spacer 431, the sacrificial spacer 429, the second isolation pattern 423, and the third isolation layer pattern 424. The dielectric layer 435 may be conformally formed on the resultant structures.

In example embodiments, the dielectric layer 435 may be formed using a material that increases the coupling ratio of the flash memory device. When the dielectric layer 435 includes a material having a dielectric constant substantially larger than those of the tunnel insulation layer pattern 406 and the gate insulation layer pattern 408, the flash memory device may have a considerably increased coupling ratio. For example, the dielectric layer 435 may be formed using a metal compound such as hafnium oxide (HfOx), aluminum oxide (AlOx), tantalum oxide (TaOx), zirconium oxide (ZrOx), etc. Alternatively, the dielectric layer 435 may have a multilayer structure that includes a lower oxide film, a nitride film and an upper oxide film. The dielectric layer 435 may have a thickness of about 100 Å to about 200 Å.

Figure 36:
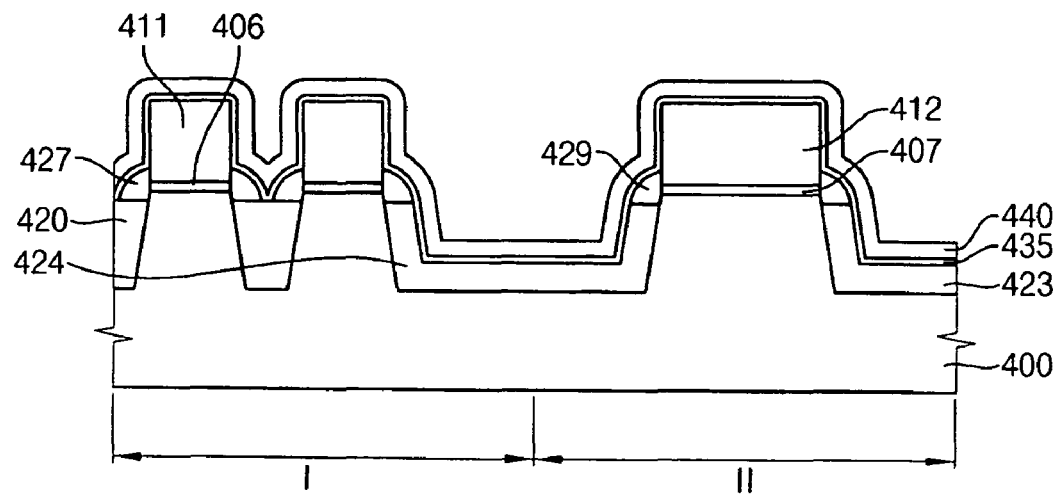

Referring to FIG. 36, a second conductive layer 440 may be formed on the dielectric layer 435. The second conductive layer 440 may also be conformally formed on the dielectric layer 435 along the profiles of the resultant structures on the substrate 400. The second conductive layer 440 may be formed using polysilicon, a metal and/or a metal compound by a CVD process, an ALD process, a PECVD process, a sputtering process, a PLD process, an evaporation process, etc. The second conductive layer 440 may have a thickness of about 500 Å to about 1,000 Å based on an upper face of the dielectric layer 435.

Figure 37:
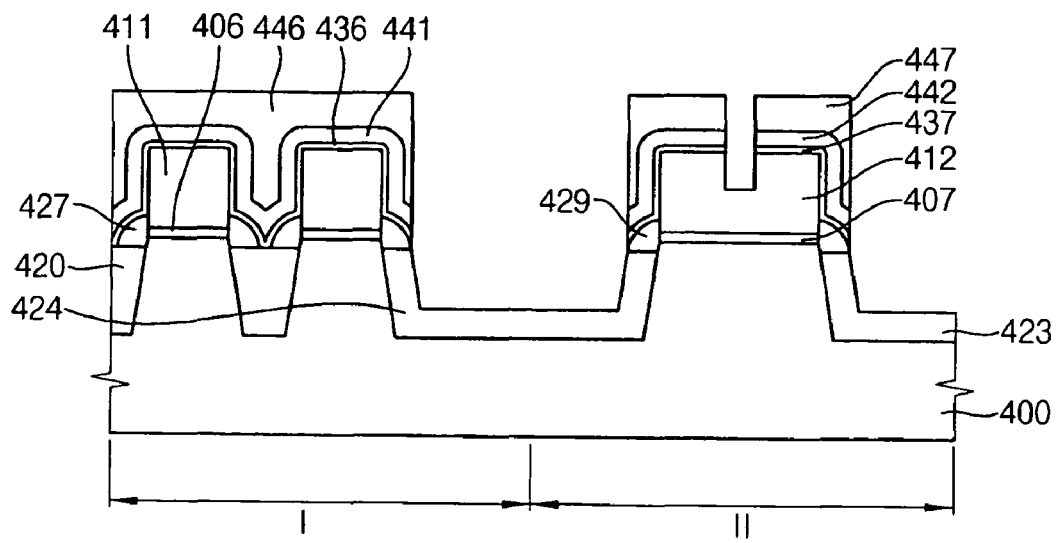

Referring to FIG. 37, a first butting mask 446 and a second butting mask 447 may be provided on the second conductive layer 440 in the first and the second areas I and II, respectively. The first butting mask 446 may cover the first conductive structures in the first area I. The second butting mask 447 may partially cover the second conductive structures in the second area II. A central portion of the second conductive structure may be exposed through the second butting mask 447, so that a portion of the second conductive layer 440 is exposed by the second butting mask 447. Further, a portion of the second conductive layer 440 between the first and the second areas I and II may be exposed after formations of the first and the second butting masks 446 and 447. That is, a portion of the second conductive layer 440 positioned over the third isolation layer pattern 424 may be exposed when the first and the second butting masks 446 and 447 are formed.

The second conductive layer 440 and the dielectric layer 435 may be etched using the first and the second butting masks 145 and 146 as etching masks. Additionally, portions of the second conductive layer 440, the dielectric layer 435, and the lower electrode 412 in the second area II may be etched while partially removing the second conductive layer 440 and the dielectric layer 435. Hence, a first dielectric layer pattern 436 and a first control gate 441 may be formed in the first area I, and a preliminary second dielectric layer pattern 437 and a first upper electrode 442 may be formed in the second area II. When the lower electrode 412 is partially etched, a dent or a recess may be provided on the lower electrode 412.

In example embodiments, the first dielectric layer pattern 436 may cover the floating gate 411 and the first spacer 431 in the first area I. Further, the first dielectric layer pattern 436 may cover all of the floating gates and the first spacers in the first area I. That is, the cell transistors in the first area I may share one common first dielectric layer pattern 436. Similarly, the cell transistors may also share one first control gate 441 formed on the first dielectric layer pattern 436. However, the high voltage transistors in the second area II may not share one common dielectric layer pattern. That is, the preliminary second dielectric layer pattern 437 may be separated from adjacent preliminary second dielectric layer pattern. The preliminary second dielectric layer pattern 437 may cover the sacrificial spacer 429 and the lower electrode 412, and the first upper electrode 442 may be positioned on the preliminary second dielectric layer pattern 437. In the reading and erasing operations of the flash memory device, charges may not be stored in the lower electrode 412 of the second conductive structure, so that the lower electrode 412 and the first upper electrode 442 may make contact with upper electrodes successively formed.

Figure 38:
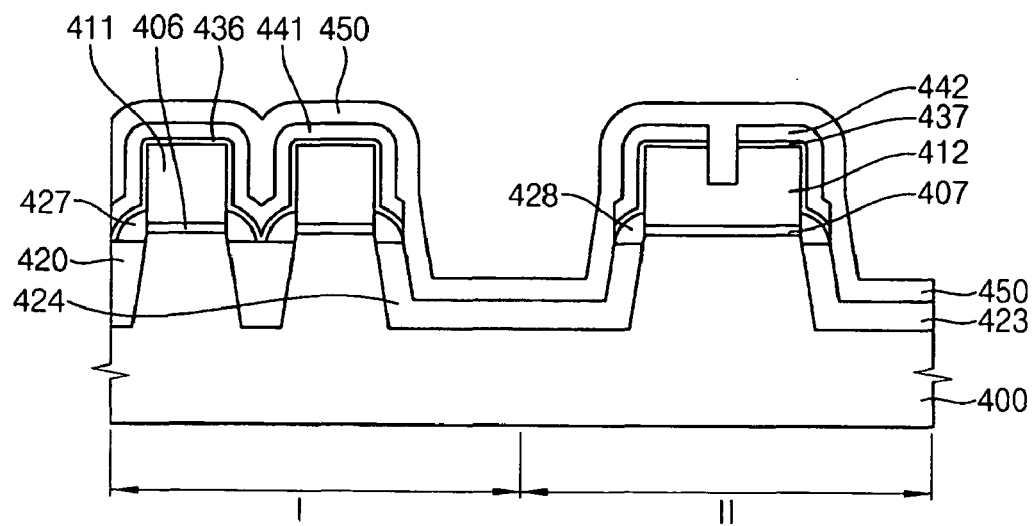

Referring to FIG. 38, after the first and the second butting masks 446 and 447 may be removed from the first control gate 441 and the first upper electrode 442, a third conductive layer 450 may be formed on the first control gate 441, the third isolation layer pattern 424, and the first upper electrode 442. The third conductive layer 450 may fill up the dent or the recess exposing the lower electrode 412. Thus, the third conductive layer 550 may make contact with the lower electrode 412.

The third conductive layer 450 may be formed using polysilicon, a metal and/or a metal compound by a CVD process, an ALD process, a PECVD process, a sputtering process, a PLD process, an evaporation process, etc. The third conductive layer 450 may have a thickness of about 500 Å to about 1,000 Å.

In example embodiments, the third conductive layer 450 may include a material substantially the same as, or substantially similar to, that of the second conductive layer 440 and/or that of the first conductive layer 410. Alternatively, the first to the third conductive layers 410, 440 and 450 may be formed using different materials, respectively.

Figure 39:
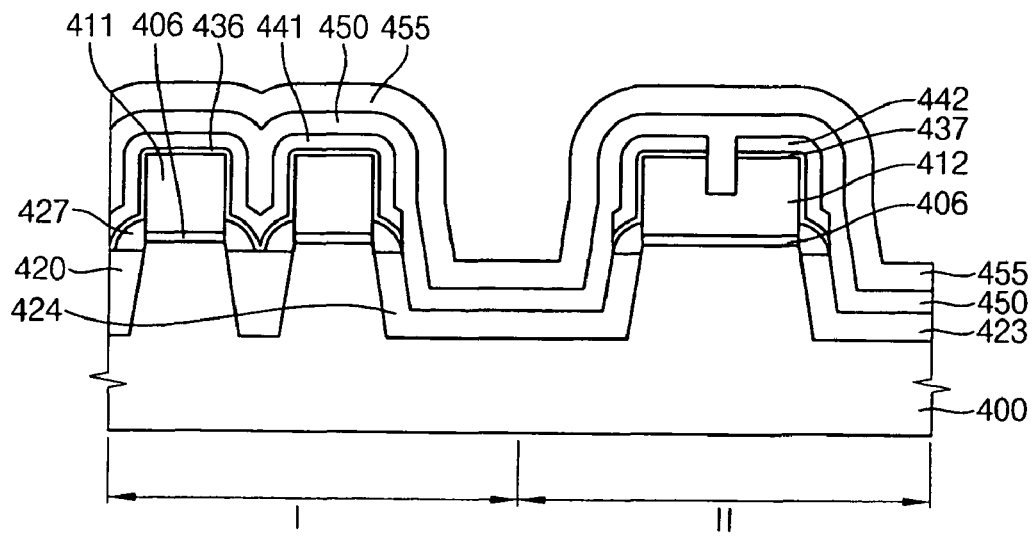

Referring to FIG. 39, a fourth conductive layer 455 may be formed on the third conductive layer 450. The third and the fourth conductive layers 450 and 455 may be conformally formed along profiles of the resultant structures on the substrate 400. The fourth conductive layer 455 may be formed using a metal and/or a metal compound by a CVD process, a PECVD process, a sputtering process, a PLD process, an evaporation process, etc. In one example embodiment, the fourth conductive layer 455 may have a multilayer structure that includes a tungsten film and a tungsten silicide film. The fourth conductive layer 455 may have a thickness of about 500 Å to about 1,000 Å based on an upper face of the third conductive layer 450.

In some example embodiments, a thermal treatment process may be performed on the substrate 400 having the fourth conductive layer 455, the third conductive layer 450, and the lower electrode 412. The thermal treatment process may improve adhesion strengths between the fourth conductive layer 455 and the third conductive layer 450 and between the fourth conductive layer 455 and the lower electrode 412. Additionally, contact resistances among the fourth conductive layer 455, the third conductive layer 450 and the lower electrode 412 may be reduced because of the thermal treatment process. The thermal treatment process may be executed at a temperature below about 850° C. under an atmosphere including nitrogen.

Figure 40:
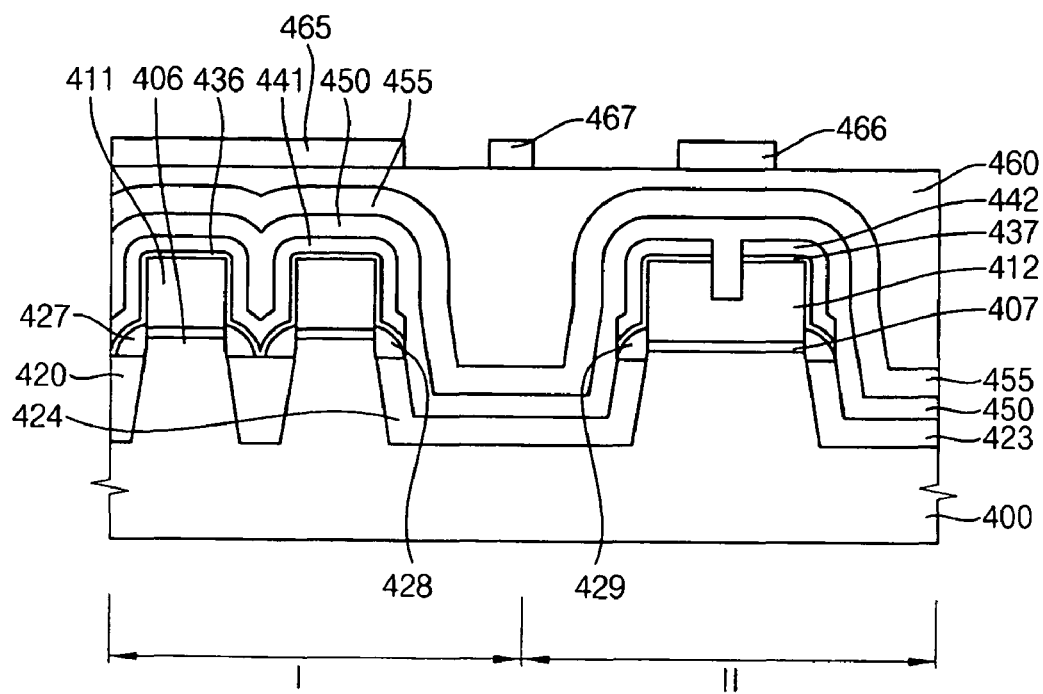

Referring to FIG. 40, a mask layer 460 may be formed on the fourth conductive layer 455. The mask layer 460 may have a predetermined thickness to fully fill up the recess 434 positioned over the third isolation layer pattern 424 between the first and the second areas I and II. The mask layer 460 may be formed using an oxide, a nitride and/or an organic material by a CVD process, a PECVD process, an HDP-CVD process, etc. For example, the mask layer 460 may include silicon oxide, silicon nitride, carbon, etc.

In example embodiments, the mask layer 460 may have a multilayer structure. For example, the mask layer 460 may include an oxide film, a carbon film and a nitride film. Here, the oxide film may have a thickness of about 2,000 Å to about 3,000 Å, and the carbon film may also have a thickness of about 2,000 Å to about 3,000 Å. Further, the nitride film may have a thickness of about 500 Å to about 1,000 Å. The nitride film may also serve as an antireflective layer. The mask layer 460 may be planarized by a planarization process to ensure a level upper face thereof.

A first photoresist pattern 465, a second photoresist pattern 466, and a third photoresist pattern 467 may be formed on the mask layer 460. The first photoresist pattern 465 may be formed on a first portion of the mask layer 460 in the first area I. The second photoresist pattern 466 may be formed on a second portion of the mask layer 460 in the second area II. The third photoresist pattern 467 may be formed on a third portion of the mask layer 460 between the first and the second areas I and II.

In example embodiments, the first photoresist pattern 465 may have a width substantially larger than that of the second photoresist pattern 466 and that of the third photoresist pattern 467. Further, the second photoresist pattern 466 may have a width substantially wider than that of the third photoresist pattern 467.

Figure 41:
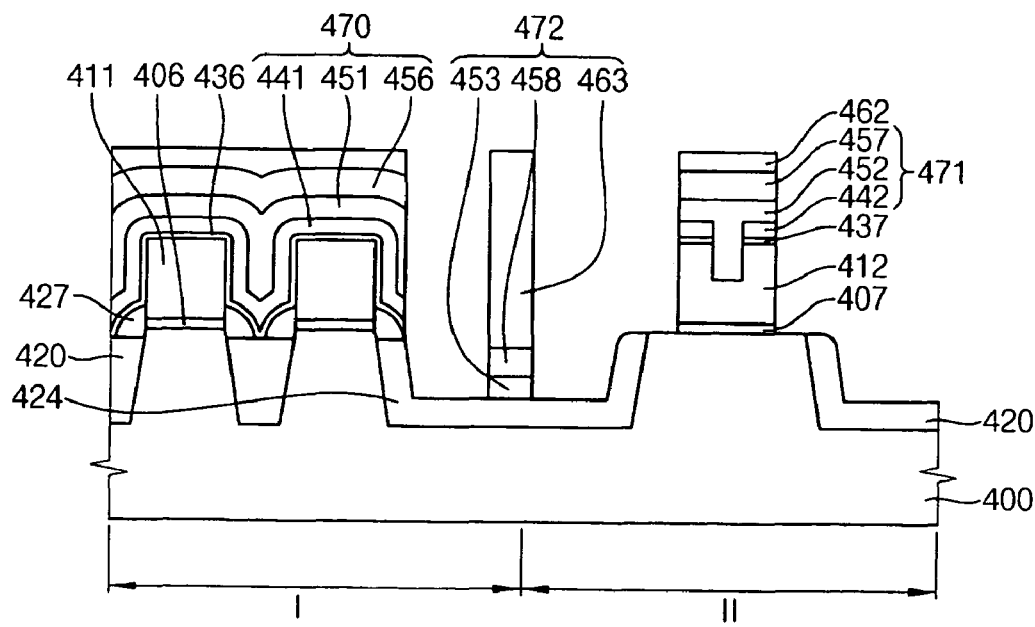

Referring to FIG. 41, the mask layer 460 may be etched using the first to the third photoresist patterns 465, 466 and 467 as etching masks. Hence, a first mask 461, a second mask 462, and a third mask 463 may be formed on the fourth conductive layer 455. The first mask 461 may be formed on a first portion of the fourth conductive layer 455 in the first area I. The second mask 462 may be formed on a second portion of the fourth conductive layer 455 in the second area II. The third mask 463 may be formed on a third portion of the fourth conductive layer 455 between the first and the second areas I and II. Therefore, gate structures may be provided in the second area II while forming the cell transistors in the first area I. Each gate structure may include a first upper electrode 442, the second dielectric layer pattern 437, the lower electrode 412, and the gate insulation layer pattern 407.

In accordance with the dimensions of the first to the third photoresist patterns 465, 466 and 467, the first mask 461 may have a width substantially larger than those of the second and the third masks 462 and 463, and the second mask 462 may also have a width substantially wider than that of the third mask 463.

The fourth conductive layer 455 and the third conductive layer 450 may be etched using the first to the third masks 461, 462 and 463 and etching masks to thereby form a control gate structure 470, an upper electrode structure 471, and a preliminary buried shield structure 472. The control gate structure 470 may be on the first dielectric layer pattern 436 in the first area I. The upper electrode structure 471 may be on the lower electrode 412 and the second dielectric layer pattern 437 in the second area II. The preliminary buried shield structure

472 may be on the third isolation layer pattern 424 between the first and the second areas I and II.

The control gate structure 470 may include the first control gate 441, a second control gate 451, and a third control gate 456. The second and the third control gates 451 and 452 may be formed by etching portions of the third and the fourth conductive layers 450 and 455 in the first area I. As described above, the cell transistors may additionally share the second control gate 451 and the third control gate 456. The upper electrode structure 472 may include the first upper electrode 442, a second upper electrode 452, and a third upper electrode 457. The second and the third upper electrodes 452 and 457 may be formed by etching portions of the third and the fourth conductive layers 450 and 455 in the second area II. Because the first upper electrode 442 is in electrical contact with the lower electrode 412, the upper electrode structure 472 may be electrically connected to the lower electrode 412.

The preliminary buried shield structure 472 may include a first pattern 453, a second pattern 458, and the third mask 463. The first pattern 453 may be positioned on the third isolation layer pattern 424. The first pattern 453 and the second pattern 458 may be formed by etching portions of the third conductive layer 450 and the fourth conductive layer 455 between the first and the second areas I and II. The preliminary buried shield structure 472 may be formed together with the cell transistors and the high voltage gate structures without any additional process.

In example embodiments, the sacrificial spacer 429 may be removed in the formation of the high voltage gate structures in the second area II. Further, widths of the lower electrode 412, the second dielectric layer pattern 437, and the first upper electrode 442 may be reduced because the lower electrode 412, the second dielectric layer pattern 437, and the first upper electrode 442 may be partially etched while forming the high voltage gate structures in the second area II.

Figure 42:
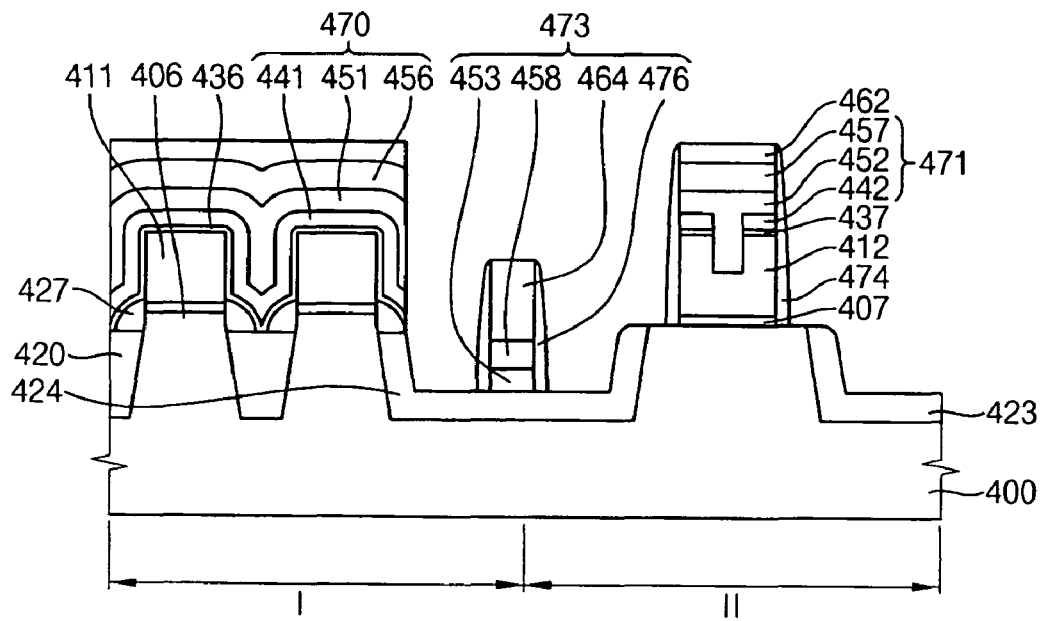

Referring to FIG. 42, the third mask 463 of the preliminary buried shield structure 472 may be partially removed to form a third pattern 464 on the second pattern 458. When the third mask 463 has the carbon film and the nitride film, the carbon and the nitride films may be removed to form the third pattern 464 having a thickness considerably smaller than that of the third mask 463, so that a buried shield structure 473 may have a height considerably smaller than that of the preliminary buried shield structure 472. The buried shield structure 473 may include the first to the third patterns 453, 458 and 464, and a sidewall spacer 476 on a sidewall thereof.

A second spacer 474 may be formed on a sidewall of the high voltage gate structure in the second area II. The high voltage transistor may include the gate insulation layer pattern 407, the lower electrode 412, the second dielectric layer pattern 437, the upper electrode structure 471, the second mask 462, and the second spacer 474.

In example embodiments, the second spacer 474 and the sidewall spacer 476 may be formed using a nitride or an oxynitride, e.g., silicon nitride or silicon oxynitride. Alternatively, the second and the sidewall spacers 474 and 476 may be formed using an oxide, e.g., silicon oxide, such as middle temperature oxide.

Figure 43:
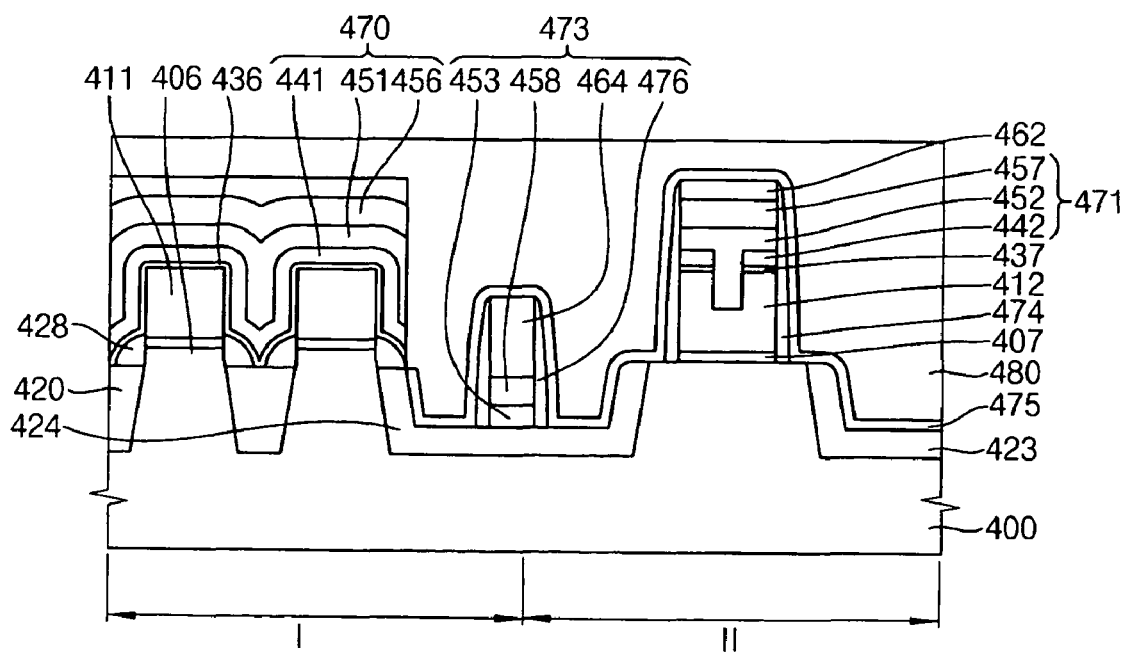

Referring to FIG. 43, an etch stop layer 475 may be formed on the substrate 400 to cover the buried shield structure 473 and the high voltage transistor except for the cell transistors in the first area I. The etch stop layer 475 may be conformally formed on the second and the third isolation layer patterns 423 and 424 along profiles of the buried shield structure 473 and the high voltage transistors. The etch stop layer 475 may be formed using a nitride, e.g., silicon nitride. The etch stop layer 475 may have a thickness of about 200 Å to about 500 Å measured from upper faces of the second and the third isolation layer patterns 423 and 424.

An insulation interlayer 480 may be formed on the etch stop layer 475 to cover the cell transistors. The insulation interlayer 480 may be formed using silicon oxide by a CVD process, an LPCVD process, a PECVD process, an HDP-CVD process, etc. In the formation of the insulation interlayer 480, a first oxide film may be formed on the etch stop layer 475 and the first mask 461, and then a second oxide film may be formed on the first oxide film. The first oxide film may have a thickness of about 1,000 Å to about 2,000 Å, and the second oxide film may have a thickness off about 4,000 Å to about 6,000 Å. Each of the first and the second oxide films may be formed by an HDP-CVD process. When the insulation interlayer 480 has a multilayer structure, the insulation interlayer 480 may effectively cover the cell transistors, the buried shield structure 473 and the high voltage transistors without generations of voids or seams therein.

Figure 44:
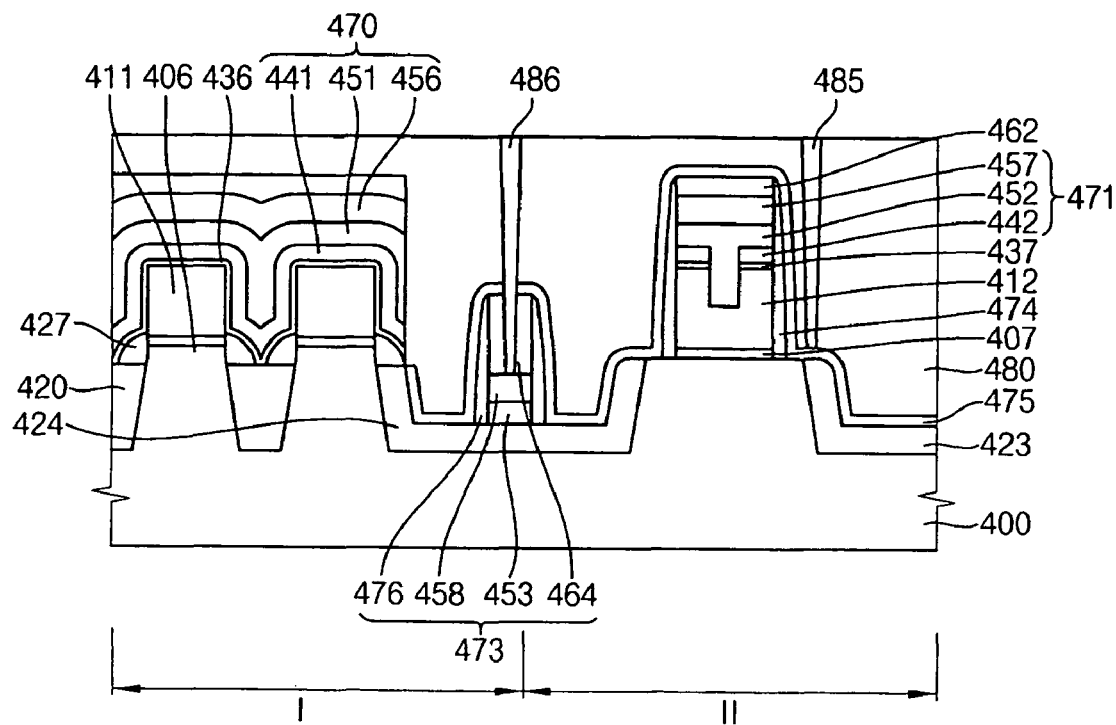

Referring to FIG. 44, the insulation interlayer 480 and the etch stop layer 475 may be partially etched to form a first contact hole (filled) in the second area II. Additionally, the insulation interlayer 480, the etch stop layer 475 and the third pattern 464 are partially etched to form a second contact hole (filled) between the first and the second areas I and II. The first contact hole may expose source/drain regions of the high voltage transistor. The second contact hole may expose the second pattern 458 of the buried shield structure 473.

An upper conductive layer (not illustrated) may be formed on the insulation interlayer 480 to fill up the first and the second contact holes. The upper conductive layer may be formed using a metal and/or a metal compound by a CVD process, a sputtering process, a PECVD process, a PLD process, an evaporation process, etc.

The upper conductive layer may be removed until the insulation interlayer 480 is exposed, such that a first contact 485 and a second contact 486 are formed in the first contact hole and the second contact hole. Upper conductive lines may be provided on the insulation interlayer 480 while forming the first and the second contacts 485 and 486.

According to example embodiments, the buried shield structure 473 may be formed between the first and the second areas I and II, such that an inversion of the flash memory device may be prevented to thereby enhance electrical characteristics of the flash memory device. For example, the breakdown of the flash memory device may be effectively prevented to thereby improve the electrical characteristics of the flash memory device because the buried shield structure 473 is positioned between the cell transistor and the high voltage transistor.

Figure 45:
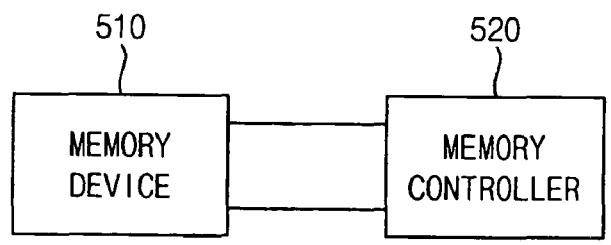
FIG. 45 illustrates a block diagram of one memory system in accordance with example embodiments.

FIG. 45 illustrates a block diagram of a memory system in accordance with example embodiments.

Referring to FIG. 45, the memory system may include a memory controller 520 and a memory device 510 electrically connected to the memory controller 520. The memory device 510 may include a flash memory device having at least one buried shield structure. Here, the flash memory device may be manufactured through any of the above-described processes according to embodiments. Alternatively, the memory device 510 may include other non-volatile semiconductor memory devices or volatile semiconductor devices, e.g., DRAM devices, SRAM devices, etc. The memory controller 520 may provide an input signal into the memory device 510 to control the reading and the erasing operations of the memory device 510. For example, various signals such as command (CMD), address (ADD), input/output data (DQ) or a high-voltage (VPP) signal may be applied to the memory controller 520. The memory controller 520 may control the memory device 510 based on the applied various signals. The memory system may be employed in various electronic apparatuses such as a cellular phone, a portable multimedia player, a digital camera, etc.

Figure 46:
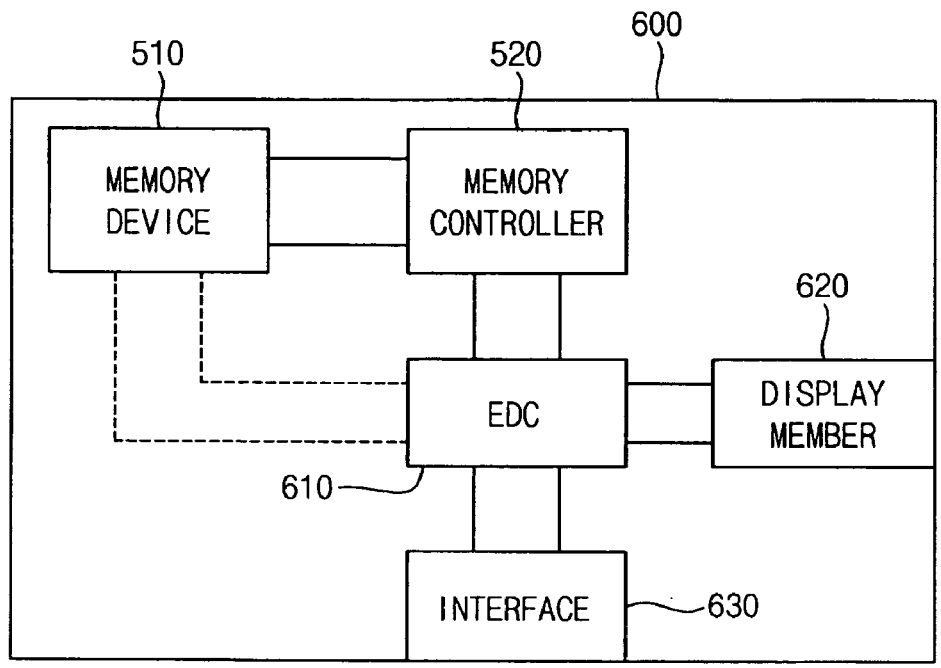
FIG. 46 illustrates a block diagram of another memory system in accordance with example embodiments.

FIG. 46 illustrates a block diagram of another memory system in accordance with example embodiments.

Referring to FIG. 46, the memory system may be used in a portable electronic apparatus 600. The portable electronic apparatus 600 may include an MP3 player, a portable video player, a portable multimedia player, a digital camera, etc. The memory system in the portable electronic apparatus 600 includes a memory device 510 and a memory controller 520. Further, the memory system includes an encoder/decoder (EDC) 610, a display member 620 and an interface 630. The memory device 510 may include a flash memory device having at least one buried shield structure.

The EDC 610 may input/output data, e.g., audio data or video data, into/from the memory device 510 through the memory controller 520. Alternatively, the data may be directly input from the EDC 610 into the memory device 510 or may be directly output from the memory device 510 into the EDC 610.

The EDC 610 may encode data stored in the memory device 510. For example, the EDS 610 may carry out encoding of MP3 files to store the audio data in the memory device 510. Alternatively, the EDC 610 may encode MPEG files to store video data into the memory device 510. Further, the EDS 610 may include a compound encoder for encoding different file types of various data. For example, the EDC 610 may include an MP3 encoder for the audio data and an MPEG encoder for the video data.

The EDC 610 may decode data stored in the memory device 510. For example, the EDC 610 may perform decoding of the MP3 files based on the audio data stored in the memory device 510. Alternatively, the EDC 610 may execute decoding of MPEG files from the video data stored in the memory device 510. Thus, the EDC 610 may include an MP3 decoder for the audio data and an MPEG decoder for the video data.

In example embodiments, the EDC 610 may include a decoder without an encoder. For example, encoded data may be input into the EDC 610, and then the encoded data may be directly stored into the memory device 510 or may be stored into the memory device 510 through the memory controller 520 when the EDC 810 has the decoder only.

In example embodiments, the EDC 610 may receive data for encoding or encoded data through the interface 630. The interface 630 may meet a predetermined reference such as FireWire (1394) or USB. For example, the interface 630 may include a FireWire interface or a USB interface. Further, the data stored in the memory device 510 may be output through the interface 630.

The display member 620 may display the data output from the memory device 510 or the decoded data from the EDC 610. For example, the display member 620 may include a speaker jack to output the audio data and/or a display screen to display the video data.

Figure 47:
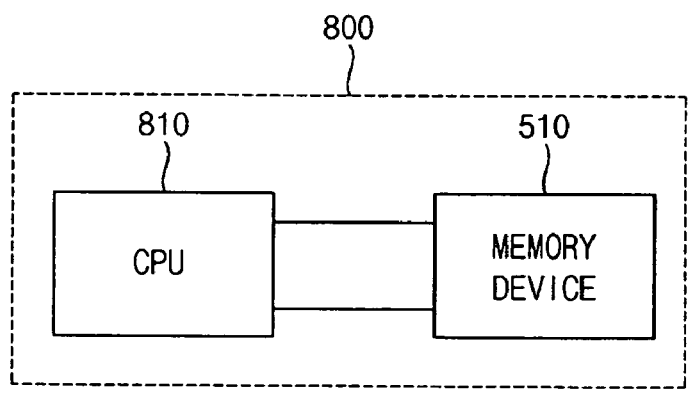
FIG. 47 illustrates a block diagram of still another memory system in accordance with example embodiments.

FIG. 47 illustrates a block diagram of still another memory system in accordance with example embodiments.

Referring to FIG. 47, the memory system may include a memory device 510 and a central processing unit (CPU) 810 in a computer system 800. The memory device 510 may be electrically connected to the CPU 810. For example, the computer system 800 may include a personal computer, a personal data assistant, etc. The memory device 510 may be directly connected to the CPU 810 or may be electrically connected to the CPU 810 through a bus.

According to example embodiments, a semiconductor device having at least one buried shield structure may be manufactured through simplified processes. Since the semiconductor device includes the buried shield structure formed at a predetermined position of a substrate, the semiconductor device may ensure enhanced electronic characteristics and also may have improved integration degree without electronic failures thereof. Further, because a control gate structure and an upper electrode structure have a multilayer structure, the semiconductor device may have a high coupling ratio for achieving high storage capacity. Finally, while the at least one buried shield structure has been illustrated between a high voltage transistor and a cell transistor, the at least one buried shield structure may be between adjacent high voltage transistors.

Example embodiments of the invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A semiconductor device, comprising:
a substrate having a first area and a second area;
a first transistor in the first area;
a second transistor in the second area;
an isolation layer between the first area and the second area; and
at least one buried shield structure on the isolation layer between the first and the second areas, wherein a top surface of the buried shield structure is lower than a top surface of the first transistor.

2. The semiconductor device as claimed in claim 1, wherein the first transistor is a cell transistor and the second transistor is a high voltage transistor.

3. The semiconductor device as claimed in claim 1, wherein the buried shield structure comprises a first pattern, a second pattern, and a third pattern sequentially formed on the isolation layer.

4. The semiconductor device as claimed in claim 3, wherein the buried shield structure further comprises a sidewall spacer on sidewalls of the first to the third patterns.

5. The semiconductor device as claimed in claim 3, wherein the second pattern includes polysilicon, metal and/or metal compound.

6. The semiconductor device as claimed in claim 3, wherein the third pattern includes at least of silicon oxide, silicon nitride, and carbon.

7. The semiconductor device as claimed in claim 1, wherein a plurality of buried shield structures is on the isolation layer between the first and the second areas.

8. The semiconductor device as claimed in claim 3, wherein the first pattern includes polysilicon, metal, and/or metal compound.

9. The semiconductor device as claimed in claim 8, wherein the first pattern includes at least one of polysilicon doped with impurities, tungsten, titanium, aluminum, tantalum, tungsten nitride, tungsten silicide, titanium nitride, titanium silicide, aluminum nitride, titanium aluminum nitride, tantalum nitride, cobalt silicide, and zirconium silicide.

10. The semiconductor device as claimed in claim 1, wherein the isolation layer includes a recess and the buried shield structure is located on the recess.

11. The semiconductor device as claimed in claim 10, wherein the buried shield structure includes a sidewall spacer.

12. A semiconductor device, comprising:
a substrate having a first area and a second area;
a first transistor in the first area;
a second transistor in the second area;
an isolation layer between the first area and the second area; and
at least one buried shield structure on the isolation layer between the first and the second areas, wherein:
the buried shield structure comprises a first pattern, a second pattern, and a third pattern sequentially formed on the isolation layer;
the first transistor includes:
  a tunnel insulation layer,
  a floating gate,
  a first dielectric layer pattern, and
  a control gate structure having a plurality of control gates on the first dielectric layer pattern; and
the second transistor includes:
  a gate insulation layer,
  a lower electrode,
  a second dielectric layer pattern, and
  an upper electrode structure having a plurality of upper electrodes.

13. The semiconductor device as claimed in claim 12, wherein the upper electrode structure electrically contacts the lower electrode through the second dielectric layer pattern.

14. The semiconductor device as claimed in claim 12, wherein the plurality of control gates includes first and the second control gates including the same material as the first and the second patterns of the buried shield structure.

15. The semiconductor device as claimed in claim 12, wherein the isolation layer includes a recess and the buried shield structure is located on the recess.

16. A semiconductor device, comprising:
a substrate having a first area and a second area;
a plurality of cell transistors in the first area;
a plurality of high voltage transistors in the second area; and
at least one buried shield structure between adjacent high voltage transistors.

17. The semiconductor device as claimed in claim 16, further comprising an isolation layer between the first area and the second area.

18. The semiconductor device as claimed in claim 17, wherein the isolation layer includes a recess and the buried shield structure is positioned on the recess.

* * * * *